(12) United States Patent
Forbes et al.

(10) Patent No.: US 6,664,879 B2
(45) Date of Patent: Dec. 16, 2003

(54) ASYMMETRIC TESSERAL SHIM COILS FOR MAGNETIC RESONANCE

(75) Inventors: Lawrence Kennedy Forbes, Hobart (AU); Stuart Crozier, Queensland (AU)

(73) Assignee: NMR Holdings No. 2 Pty Limited, Milton (AU)

( * ) Notice: Subject to any disclaimer, the term of this patent is extended or adjusted under 35 U.S.C. 154(b) by 0 days.

(21) Appl. No.: 10/234,971

(22) Filed: Sep. 4, 2002

(65) Prior Publication Data

US 2003/0112107 A1 Jun. 19, 2003

(30) Foreign Application Priority Data

Dec. 4, 2001 (AU) .............................. PR9297

(51) Int. Cl.⁷ .............................. H01F 7/00; G01V 3/00
(52) U.S. Cl. ........................ 335/301; 335/299; 324/320
(58) Field of Search ................. 335/216, 299, 335/301; 324/318, 319, 320

(56) References Cited

U.S. PATENT DOCUMENTS

| | | | |
|---|---|---|---|
| 5,198,769 A | * 3/1993 | Frese et al. .................. | 324/318 |
| 5,289,151 A | 2/1994 | Turner | |
| 5,373,239 A | * 12/1994 | Marek et al. ................ | 324/320 |
| 5,675,255 A | * 10/1997 | Sellers et al. ................ | 324/318 |
| 5,818,319 A | * 10/1998 | Crozier et al. .............. | 335/299 |
| 6,140,900 A | 10/2000 | Crozier et al. | |
| 6,377,148 B1 | 4/2002 | Forbes et al. | |

FOREIGN PATENT DOCUMENTS

AU PQ9787 8/2000

OTHER PUBLICATIONS

Abramowitz et al., *Handbook of Mathematical Functions,* 8th edition, Dover, New York, 1972, 885.
Brideson et al., "Determining complicated winding patterns for shim coils using stream functions and the Target–Field method," *Concepts in Magnetic Resonance,* 2002, 14:9–19.
Crozier et al., "Gradient–coil design by simulated annealing," *J. Magn. Reson.,* 1993,A 103:354–357.
Forbes et al., "Asymmetric zonal shim coils for Magnetic Resonance applications," *Med. Phys.,* 2001, 28:1644–1651.
Forbes et al., "A novel target–field method for finite–length Magnetic Resonance shim coils: Part 1: Zonal shims," *J. Phys. D: Appl. Phys.,* 2001, 34:3447–3455.
Forbes et al., "A novel target–field method for finite–length magnetic resonance shim coils: Part 2: Tesseral shims," *J.Phys. D.:Appl. Phys.,* 2002, 35:839–849.
Roméo et al., "Magnetic Field Profiling: Analysis and Correcting Coil Design," *Magn. Reson. Med.,* 1984, 1:44–65.
Stewart, J., *Calculus,* 4th edition, Brooks–Cole, California, 1999, 985–990.
Turner, A target field approach to optimal coil design, *J. Phys. D: Appl. Phys.,* 1986, 19:147–151.

* cited by examiner

Primary Examiner—Ramon M. Barrera
(74) Attorney, Agent, or Firm—Maurice M. Klee

(57) ABSTRACT

Asymmetric tesseral coils and sets for magnetic resonance applications are provided. Also provided are methods for designing such coils, as well as coils generating arbitrary field profiles. In certain embodiments, the coils are rigorously constrained to have finite dimensions.

43 Claims, 13 Drawing Sheets

ASYMMETRIC TESSERAL SHIM COILS FOR MAGNETIC RESONANCE

1. FIELD OF THE INVENTION

This invention relates to shim coils. In particular, the invention relates to shim coils suitable for use in magnetic resonance applications that generate tesseral fields located asymmetrically in a finite-length coil. A method for the design of such shim coils of the type useful for Magnetic Resonance applications is described. The method involves a type of target-field approach, but the exact geometry of the shim coils is treated without approximation. In particular, the fact that shim coils are of finite length is catered for. Although illustrated herein in terms of shim coils, the methods of the invention can also be used to design essentially any type of coil which is to be used to produce a desired magnetic field, including, without limitation, gradient coils and $H_0$-producing coils.

2. BACKGROUND TO THE INVENTION

In magnetic resonance imaging (MRI) applications, a patient is placed in a strong and homogeneous static magnetic field, causing the otherwise randomly oriented magnetic moments of the protons, in water molecules within the body, to precess around the direction of the applied field. The part of the body in the homogeneous region of the magnet is then irradiated with radio-frequency (RF) energy, causing some of the protons to change their spin orientation. When the RF energy source is removed, the protons in the sample return to their original configuration, inducing a measurable signal in a receiver coil tuned to the frequency of precession. This is the magnetic resonance (MR) signal. Most importantly, the frequency at which protons absorb the RF signal depends on the background magnetic field.

In practice, the presence of the patient's body perturbs the strong magnetic field slightly, and so shim coils are used to correct the field, to give the best possible final image. The field within a specified target volume (the diameter of the sensitive volume, or DSV) is typically represented in terms of spherical harmonics, and so impurities in the field are analyzed in terms of the coefficients of an expansion in these harmonics. Shim coils are therefore designed to correct a perturbed magnetic field by producing a particular spherical harmonic that can be added to the background magnetic field, so as to cancel the effect of a certain harmonic caused by an impurity. Many of these coils may be present in a particular MRI device, and each may have its own power supply, to produce the required current flow.

The major task associated with the design of these shim coils is to determine the precise windings on the coil that will produce the desired magnetic field within the coil. One method, due to Turner (1986, *A target field approach to optimal coil design*, J. Phys. D: Appl. Phys. 19, 147–151), is to specify a desired target field inside the cylinder, at some radius less than the coil radius. Fourier transform methods are then used to find the current density on the surface of the coil, required to give the desired target field. This method has been widely used and is successful in applications, but it is based on the approximation that the coil is, in some sense, infinite in length so that the Fourier transform technique can be applied. Finite-length coils can be simulated in this technique by adding a constraint that the current density must fall to zero outside some finite interval, and this is discussed by Turner in U.S. Pat. No. 5,289,151. Nevertheless, coils of finite length are not natural to this approach, and in some circumstances smoothing functions have to be incorporated in the Fourier transform so as to guarantee its convergence.

A related method for overcoming the difficulty associated with coils of finite length has been advanced by Forbes, Crozier and Doddrell in Australian Provisional Patent Application PQ9787 (see U.S. Pat. No. 6,377,148 B1) and Forbes and Crozier (2001, *Asymmetric zonal shim coils for Magnetic Resonance applications*, Med. Phys. 28, 1644–1651). The technique employs a target-field approach and builds in the finite length of the coils by making use of a Fourier series technique. This approach involves approximations, but is capable of designing coils for asymmetrically located fields in a very systematic way.

An alternative method for the design of coils of finite length is the stochastic optimization approach pioneered by Crozier and Doddrell (1993, *Gradient-coil design by simulated annealing*, J. Magn. Reson. A 103, 354–357). This approach seeks to produce a desired field in a given volume (the DSV) using optimization methods to adjust the location of certain loops of wire and the current flowing in those loops. The method is very robust, since it uses simulated annealing as its optimization strategy, and it can incorporate other constraints in a straightforward manner by means of a Lagrange-multiplier technique. Coils of genuinely finite length are accounted for without approximation by this technique, and it therefore has distinct advantages over the target field method (and alternative methods based on finite-elements). Since it relies on a stochastic optimization strategy, it can even cope with discontinuous objective functions, and so can accommodate adding or removing loops of wire during the optimization process. The method has the drawback that the stochastic optimization technique can take many iterations to converge, and so can be expensive of computer time. In addition, the technique is undoubtedly more difficult to apply to the design of coils that produce more complicated magnetic fields, such as those involved in higher-order spherical harmonics with tesseral components.

It is an object of the invention to provide coil structures that generate desired fields internal or external to the coil structure, that may be symmetric or non-symmetric with respect to that structure. For example, in connection with certain preferred embodiments, it is an object of the invention to provide coil structures that generate desired fields within certain specific and asymmetric portions of the coil structure.

It is a further object of the invention to provide a general systematic method for producing any desired zonal or tesseral or otherwise shaped magnetic field within and/or outside a coil, taking the finite length of the coil into account without approximation.

3. SUMMARY OF THE INVENTION

In one broad form, the invention provides a method for the design of coils for the production of magnetic fields. For example, such coils can be shim coils of the type suitable for use in Magnetic Resonance applications. The method involves a type of target-field approach, but the exact geometry of the coils is treated without approximation. In particular, the fact that coils are of finite length is catered for.

Target fields of any desired type may be specified, and may involve zonal and tesseral harmonics or any other specified field shape. The method of this invention can be used to design the coil windings needed to produce the specified target field. In this approach, there is complete freedom in the choice of target field. For example, there is no requirement to restrict the target field to any one spherical harmonic. The method is therefore able to design coils in which the region of interest is located asymmetrically with respect to the coil length. In addition, to improve the accuracy of the fields produced by the coil, the design methodology of this invention can match desired target fields at two or more different target radii, which preferably are co-axial.

In one embodiment, the invention provides a method for designing a coil, e.g., a tesseral shim coil for a magnetic resonance system, where the coil extends from $-L$ to $+L$ along a longitudinal axis which lies along the z-axis of a three dimensional coordinate system, and the method comprises the steps of:

(a) selecting a cylindrical surface having a radius $r=a$ for calculating current densities for the coil (the "$r=a$ surface"), the surface surrounding the longitudinal axis and extending from $-L$ to $+L$;

(b) selecting a set of desired values for the longitudinal component of the magnetic field $B_z$ (or $H_T$) to be produced by the coil at locations which are spaced along the longitudinal axis from $z=pL$ to $z=qL$ where $-1<p<q<1$ (for example, the desired values for the longitudinal component of the magnetic field can be defined by a preselected single tesseral or combinations of tesseral harmonics); and (c) determining a current density distribution $j(\theta,z)$ for the coil by:
(1) establishing equations for the relationships between the current density and the target fields (see, for example, equations 4.9–4.12 herein); and
(2) solving said equations using a matrix regularization method (see, for example, equations 4.13–4.17), wherein the regularized expression to be minimized, in one preferred embodiment, is the curvature of a streamfunction defined by, for example, equations 4.18 and 4.19 set forth below.

In other embodiments, the quantities for minimization in the regularization procedure can be the power and/or energy contained in the device (see, for example, equation 4.14).

The procedures outlined in (1) and (2) above can be preferably used for multiple target field regions (see, for example, equations 4.20–4.23)

The method preferably also includes the additional step of generating discrete current carrying windings for the coil from the current density distribution $j(\theta,z)$ by:

(1) using the current density vector $j(\theta,z)$ to create a streamfunction $\psi$ according to, for example, equations 4.16 and 4.17
(2) selecting a number of current carrying windings N;
(3) determining a current per winding value $I=J/N$, where J is the total obtained by integrating the current density vector over the $r=a$ surface (the "total integrated current");
(4) contouring the streamfunction * and thereby determining a set of $j(\theta,z)$ blocks over the $r=a$ surface (i.e., the surface of the current density cylinder) within the longitudinal range from $-L$ to $+L$ such that the integral of $j(\theta,z)$ over each block equals I; and
(5) for all blocks having a net polarity for $j(\theta,z)$ over the block, placing a winding at the center of the block, the direction of the current in the winding corresponding to said net polarity.

The method can be used for symmetrical and asymmetrical cases, i.e., $|p|=|q|$ and $|p|\neq|q|$, respectively.

In one of its general method aspects, the invention provides a method for designing a coil, where the coil has a longitudinal axis which lies along the z-axis of a three dimensional coordinate system, said method comprising the steps of:

(a) selecting one or more cylindrical surfaces $S_i$ ($i \geq 1$) for calculating current densities for the coil, each surface (1) having a radius $a_i$, (2) surrounding the longitudinal axis, and (3) extending from $-L_i$ to $+L_i$;

(b) selecting a set of desired values for the longitudinal component of the magnetic field $B_z$ (or $H_T$) to be produced by the coil at target locations on one or more cylindrical surfaces $T_j$ ($j \geq 1$) which extend along the longitudinal axis from $z=pL_i$ to $z=qL_i$ where $i=1$ and $-1<p<q<1$; and (c) determining current density distributions $j_i(\theta,z)$ at the $S_i$ surfaces for the coil by:
(1) expressing $B_z$ (or $H_T$) in terms of $j_i(\theta,z)$ (see, for example, equations 4.1 to 4.4 and 4.6);
(2) expressing the z-component of each of the $j_i(\theta,z)$ ($j_{zi}(\theta,z)$) in terms of a basis function expansion and constraining $j_{zi}(\theta,z)$ to equal 0 at $-L_i$ and $+L_i$, said expansion including a set of coefficients (see, for example, equation 4.7);
(3) expressing $B_z$ (or $H_T$) in terms of said basis function expansions (see, for example, equations 4.5, 4.8, 4.9 and 4.10); and
(4) for each of $j_{zi}(\theta,z)$, determining values for said set of coefficients of said basis function expansion by:
  i. selecting an error function which comprises a measure of the difference between the desired $B_z$ (or $H_T$) values at the target locations and the $B_z$ (or $H_T$) values calculated at those locations using the basis function expansions of the $j_{zi}(\theta,z)$ (see, for example, equations 4.11 and 4.12);
  ii. regularizing said error function (see, for example, equation 4.13); and
  iii. determining values for the sets of coefficients using the regularized error function (see, for example, equation 4.14–4.15); and
(5) determining the azimuthal-component of $j_i(\theta,z)$ ($j_{\theta i}(\theta,z)$) using the values for the sets of coefficients determined in step (c)(4) and the continuity equation.

In accordance with another of its general method aspects, the invention provides a method for designing a coil comprising:

(a) selecting one or more surfaces $S_i$ ($i \geq 1$) for calculating current densities for the coil;

(b) selecting a set of desired values for one or more components of the magnetic field B (or H) to be produced by the coil at target locations on one or more surfaces $T_j$($j \geq 1$); and (c) determining current density distributions $j_i$ at the $S_i$ surfaces for the coil by:
(1) expressing B (or H) in terms of $j_i$;
(2) expressing each of the $j_i$ in terms of a basis function expansion having a set of coefficients;
(3) expressing B (or H) in terms of said basis function expansions; and
(4) for each $j_i$ determining values for said set of coefficients of said basis function expansion by:
  i. selecting an error function which comprises a measure of the difference between the desired B (or H) values at the target locations and B (or H) values calculated at those locations using the basis function expansions of the $j_i$;

ii. regularizing said error function using one or more regularization parameters, one parameter for each $j_i$, said parameter being the curvature of a stream-function for $j_i$ (see, for example, equations 4.16–4.19); and iii. determining values for the sets of coefficients using the regularized error function.

The various preferred and other embodiments discussed above and below apply to these general forms of the method aspects of the invention.

In another broad form, the invention provides coils, e.g., shim coils, for the production of tesseral magnetic fields located asymmetrically in a finite-length coil. As is well known in the art, a zonal field has complete azimuthal symmetry, i.e., it is not a function of θ in a conventional cylindrical coordinate system, while a tesseral field does not have complete azimuthal symmetry, i.e., it depends on θ.

In one embodiment, the invention provides a tesseral coil (e.g., a member of a shim set) having (i) a longitudinal axis (e.g., the z-axis) and a radius r describing a primary cylindrical surface and (ii) a predetermined volume in which at least one predetermined tesseral harmonic is generated (the tesseral harmonic volume; e.g., a shimming volume), and comprising a plurality of current-carrying windings (e.g., interconnected, arc-like, windings) associated with the primary cylindrical surface (e.g., mounted on and/or mounted in and/or mounted to a support member located at the cylindrical surface), the tesseral coil producing a magnetic field, the longitudinal component of which is given by:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta) \quad (1)$$

where $A_{nm}$ and $B_{nm}$ are the amplitudes of spherical harmonics, $P_{nm}(\cos\theta)$ are associated Legendre polynomials, n is the order and m the degree of the polynomial, and r, θ and φ are polar (spherical) co-ordinates;

and wherein:
(i) the at least one predetermined tesseral harmonic has a degree m' and an order n' which satisfy the relationships:
m'>0, and
n'≧2;
(ii) the primary cylindrical surface has first and second ends which define a length 2L therebetween; and
(iii) the tesseral harmonic volume extends along the longitudinal axis from z=pL to z=qL, where
(a) −1<p<q<1;
(b) |p|≠|q| (i.e., the tesseral harmonic volume is located asymmetrically with respect to the overall geometry of the coil); and
(c) z=0 is midway between the first and second ends of the primary cylindrical surface.

In certain embodiments of the invention, the tesseral coil generates at least one additional predetermined tesseral harmonic in the tesseral harmonic volume, said at least one additional harmonic having a degree different from m' and/or an order different from n'

Preferably, the tesseral coil is a shim coil and most preferably, the shim coil is a member of a shim set for which all of the tesseral coils in the set are of the above type.

In the case of tesseral shim coils used for high resolution spectroscopy, i.e., NMR, q−p is preferably greater than or equal to 0.01 and most preferably greater than or equal to 0.05. In the case of tesseral shim coils used for clinical imaging, i.e., MRI, q−p is preferably greater than or equal to 0.05 and most preferably greater than or equal to 0.5.

In accordance with certain preferred embodiments of the invention, the tesseral coil generates a single predetermined tesseral harmonic, the tesseral harmonic volume defines a midpoint M along the longitudinal axis, the volume has a characteristic radius c given by:

$$c=(q-p)L/2 \text{ when } q-p<1, \quad (2)$$

and by:

$$c=(q-p)L/3 \text{ when } q-p\geq 1, \quad (3)$$

and the tesseral coil has a purity (P') which is less than or equal to 0.2, where P' equals the ratio of (1) the sum of the magnitudes of all harmonic coefficients other than the coefficient of the predetermined tesseral harmonic which have a magnitude which is at least 0.001% of the magnitude of the coefficient of the predetermined tesseral harmonic to (2) the magnitude of the coefficient of the predetermined tesseral harmonic..

Most preferably, P' is less than or equal to 0.05.

In certain specific applications of the invention, the tesseral coil has the following characteristics:
(i) n'=2 or 3;
(ii) q−p≧0.7;
(iii) 2L≦1.4 meters; and
(iv) P'≦0.1;

while in other specific applications, it has the following characteristics:
(i) n'=4, 5, 6, 7, or 8;
(ii) q−p≧0.7;
(iii) 2L≦1.4 meters; and
(iv) P'≦0.2.

In each case, m' will typically be less than or equal to n'.

In other preferred embodiments, the tesseral coil produces a plurality of predetermined tesseral harmonics, the tesseral harmonic volume defines a midpoint M along the longitudinal axis, the tesseral harmonic volume has a characteristic radius c given by:

$$c=(q-p)L/2 \text{ when } q-p<1,$$

and by:

$$c=(q-p)L/3 \text{ when } q-p\geq 1;$$

and the tesseral coil has a purity (P') which is less than or equal to 0.2 (preferably less than or equal to 0.05), where P' equals the ratio of (1) the sum of the magnitudes of all harmonic coefficients other than the coefficients of the plurality of predetermined tesseral harmonics which have a magnitude which is at least 0.001% of the magnitude of the largest coefficient of the plurality of predetermined tesseral harmonics to (2) the sum of the magnitudes of the coefficients of the plurality of predetermined tesseral harmonics.

In still further preferred embodiments, the tesseral coil further comprises a shielding cylindrical surface co-axial and external to the primary cylindrical surface, said shielding cylindrical surface having a plurality of current-carrying windings associated therewith, said windings of the primary and shielding cylindrical surfaces causing the magnitude of the magnetic field generated by the tesseral coil to be below a predetermined value (preferably effectively zero) outside of a predetermined surface external to the shielding cylindrical surface. In connection with these embodiments, the shielding cylindrical surface has first and second ends which define a length 2L' therebetween, where $L'=r_bL$ and $r_b$ is preferably greater than or equal to 1.0.

For clinical imaging applications of the invention, either |p| or |q| is preferably greater than or equal to 0.7.

Asymmetric tesseral shim coils may be used in compact conventional magnet systems such as those of U.S. Pat. No. 5,818,319 or alternately, they may be used in asymmetric magnets, such as the magnets of U.S. Pat. No. 6,140,900.

4. BRIEF DESCRIPTION OF THE DRAWINGS

The invention will be described by way of examples with reference to the drawings in which.

Figure 4A:
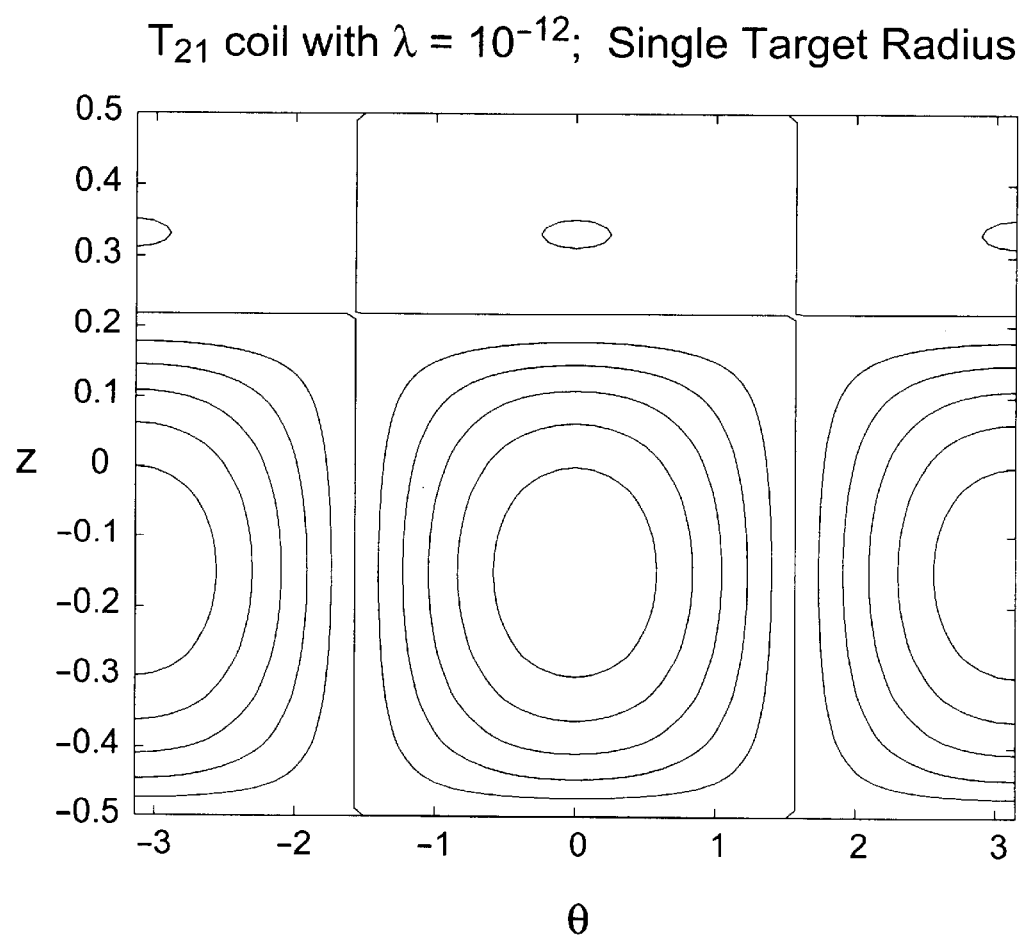
FIG. 4 shows winding patterns for a $T_{21}$ shim coil, obtained for (a) in FIG. 4a, a single target field imposed at c=0.15 meter, and (b) in FIG. 4b, two target fields imposed at radii $c_1$=0.15 meter, $c_2$=0.075 meter. The parameters used in this calculation are L=0.5 meter, a=0.2 meter, p=−0.7, q=0.1, and $H_{max}$=1 Amp/meter.
Figure 4B:
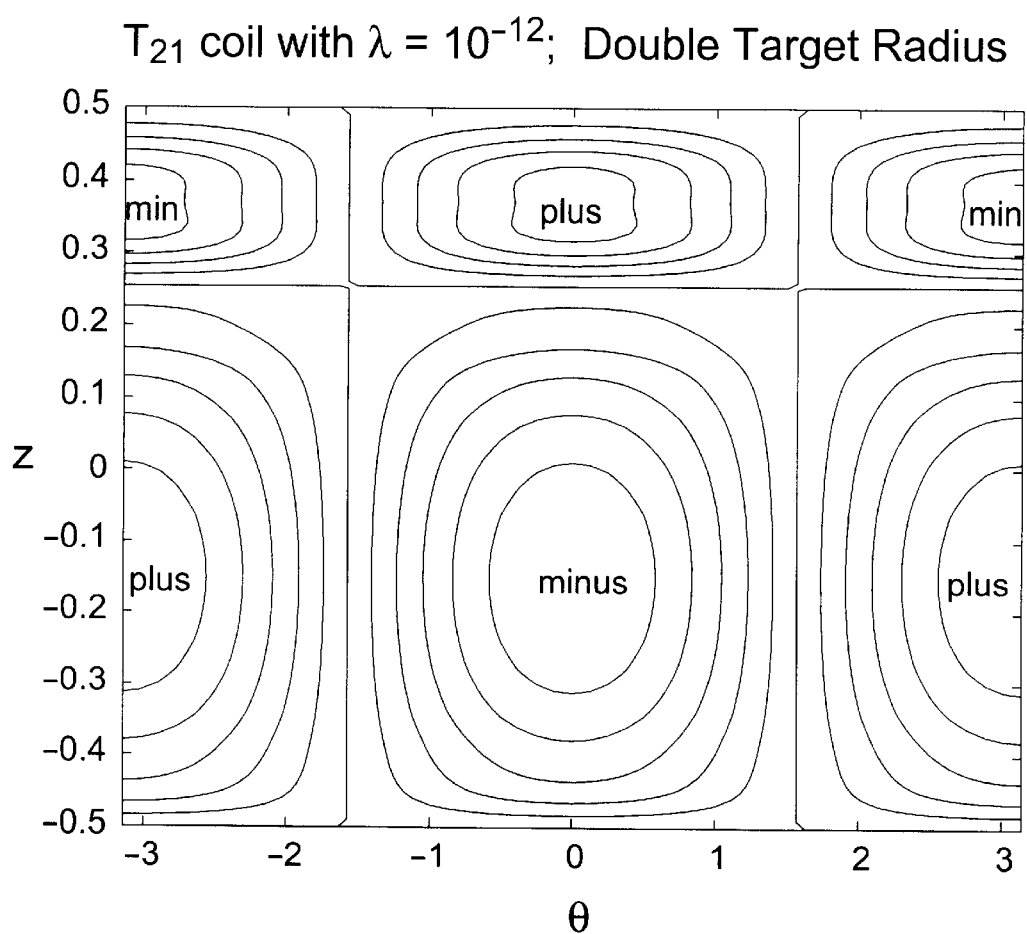
Figure 5:
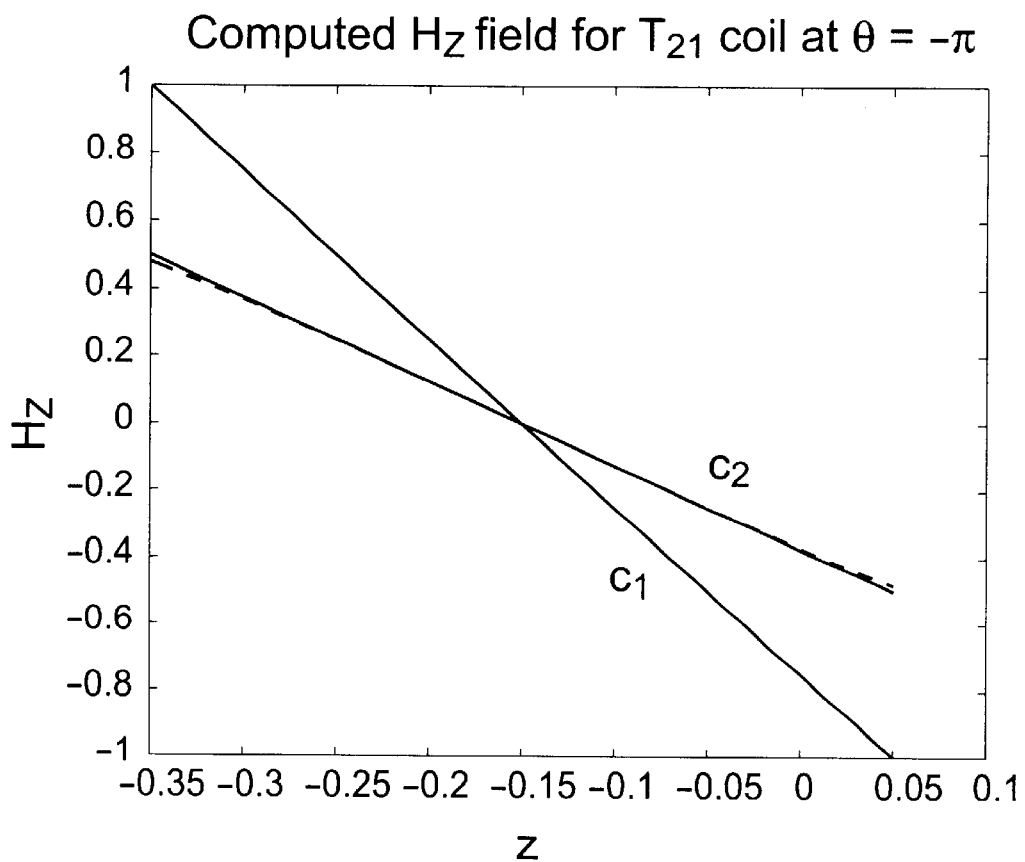

FIG. 5 shows the $H_z$ field as a function of position z along the coil, for θ=−π, evaluated at the target radii r=$c_1$ and r=$c_2$. The coil geometry is the same as for FIG. 4. The curves drawn with solid lines are the field components obtained when two target radii are used, and the curves drawn with dashed lines represent the situation in which the field is imposed at only a single target radius.

Figure 6:
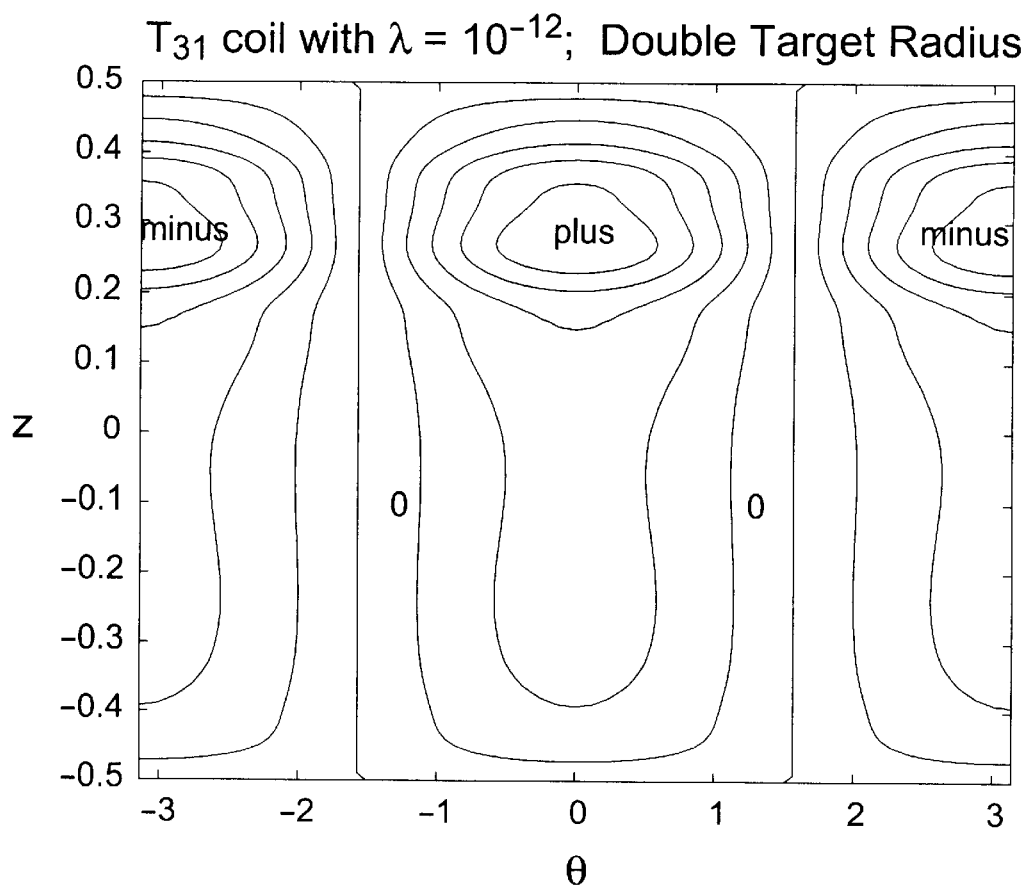

FIG. 6 shows a winding pattern for a $T_{31}$ shim coil. The parameters used in this calculation are L=0.5 meter, a=0.2 meter, p=−0.7, q=0.1, $c_1$=0.15 meter, $c_2$=0.075 meter and $H_{max}$=1 Amp/meter.

Figure 7:
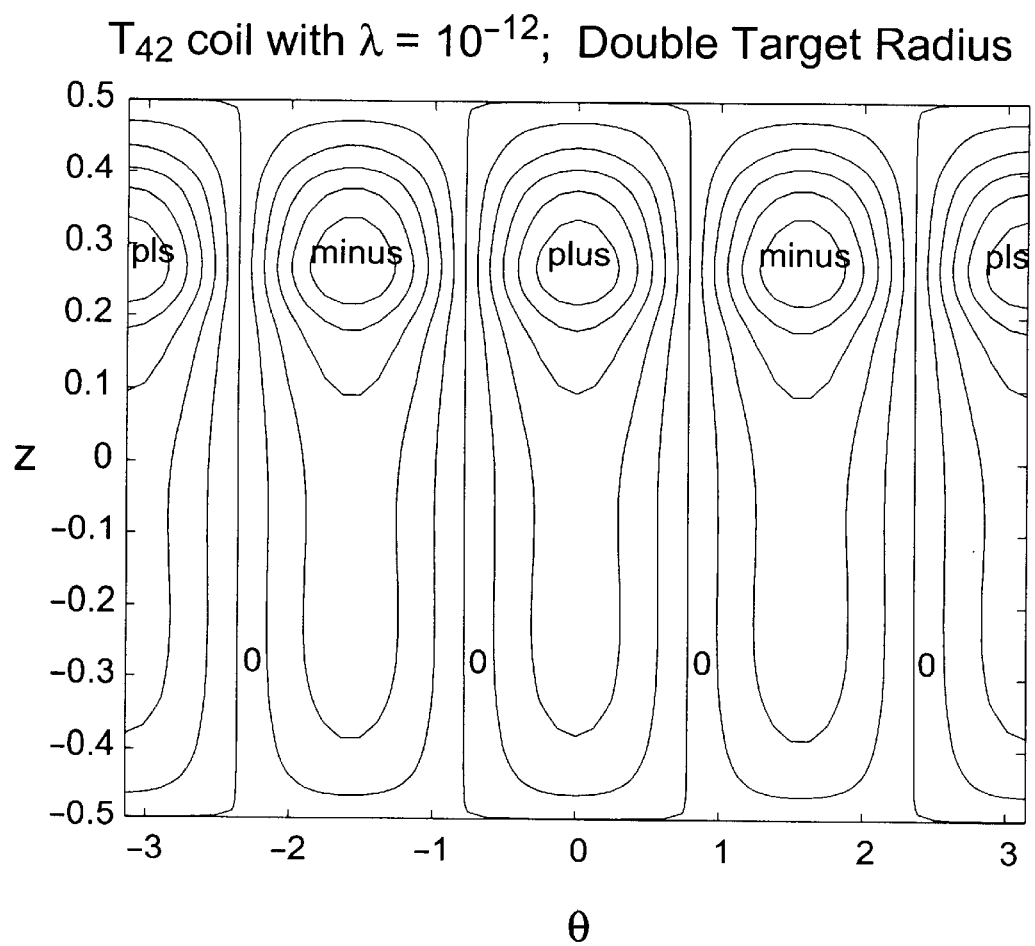

FIG. 7 shows a winding pattern for a $T_{42}$ shim coil. The parameters used in this calculation are L=0.5 meter, a=0.2 meter, p=−0.7, q=0.1, $c_1$=0.15 meter, $c_2$=0.075 meter and $H_{max}$=1 Amp/meter.

Figure 8A:
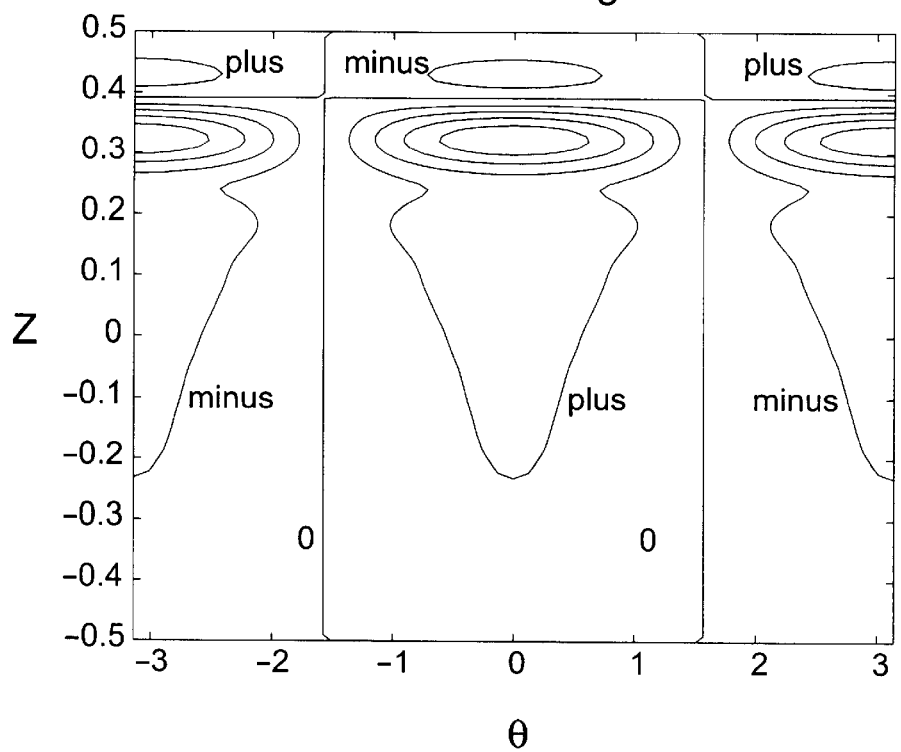
Figure 8B:
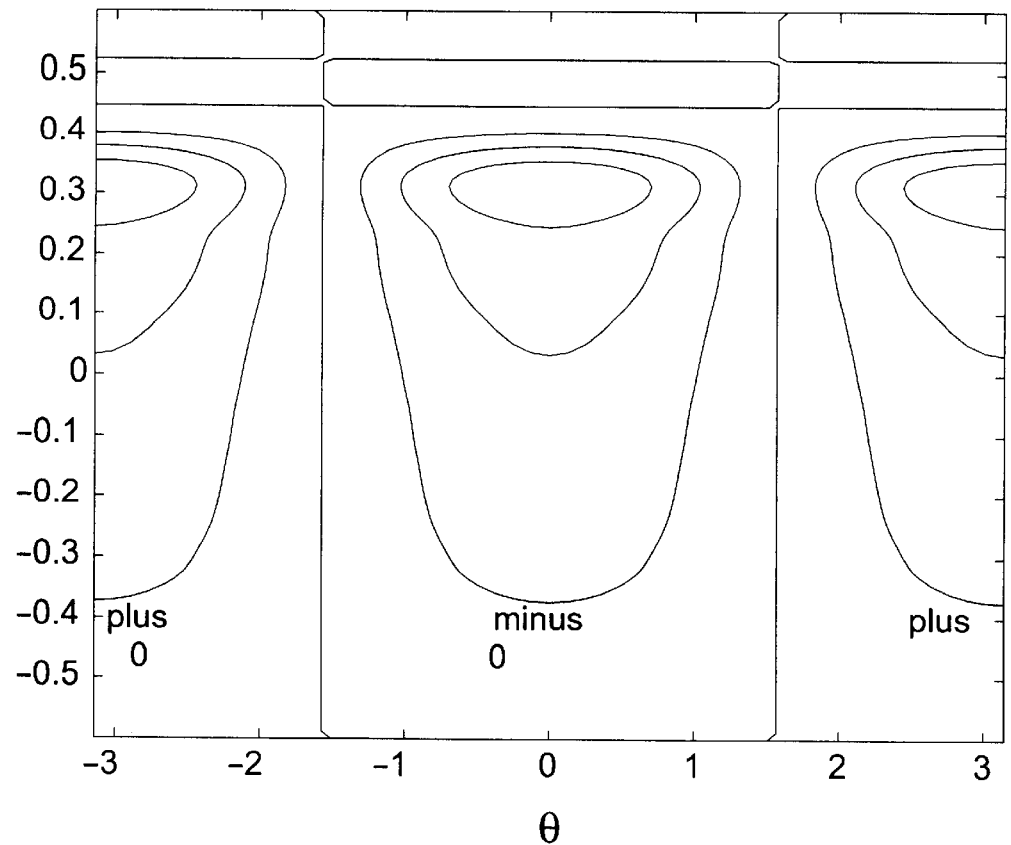

FIG. 8 shows a winding pattern for a shielded $T_{31}$ shim coil. FIG. 8(a) shows the winding pattern for the shim coil and FIG. 8(b) shows the winding pattern for the shield coil. The parameters used in this calculation are L=0.5 meter, a=0.2 meter, p=−0.7, q=0.1, $c_1$=0.15 meter, $C_2$=0.075 meter and $H_{max}$=1 Amp/meter. The shield length was 1.2 times the shim coil length and the shield radius was 0.25 meter.

Figure 9:
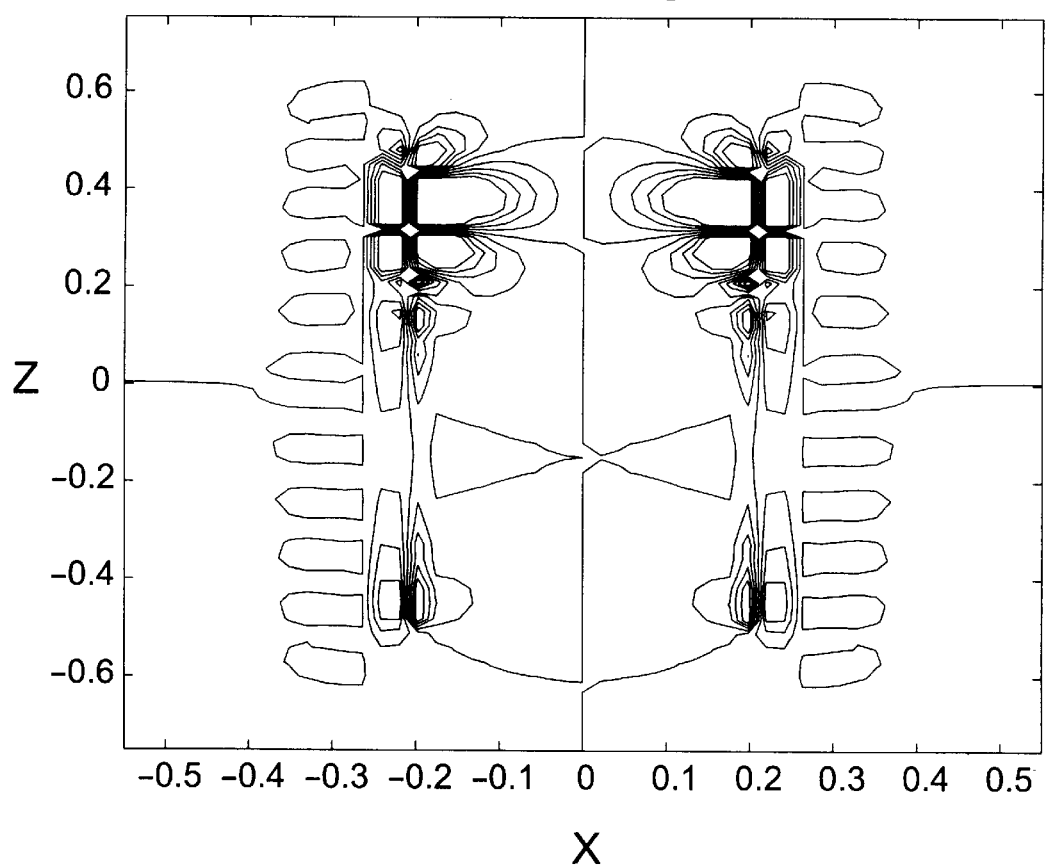

FIG. 9 shows contours for the $H_z$ component of the magnetic field produced by the shielded $T_{31}$ shim coil of FIG. 8.

Figure 10:
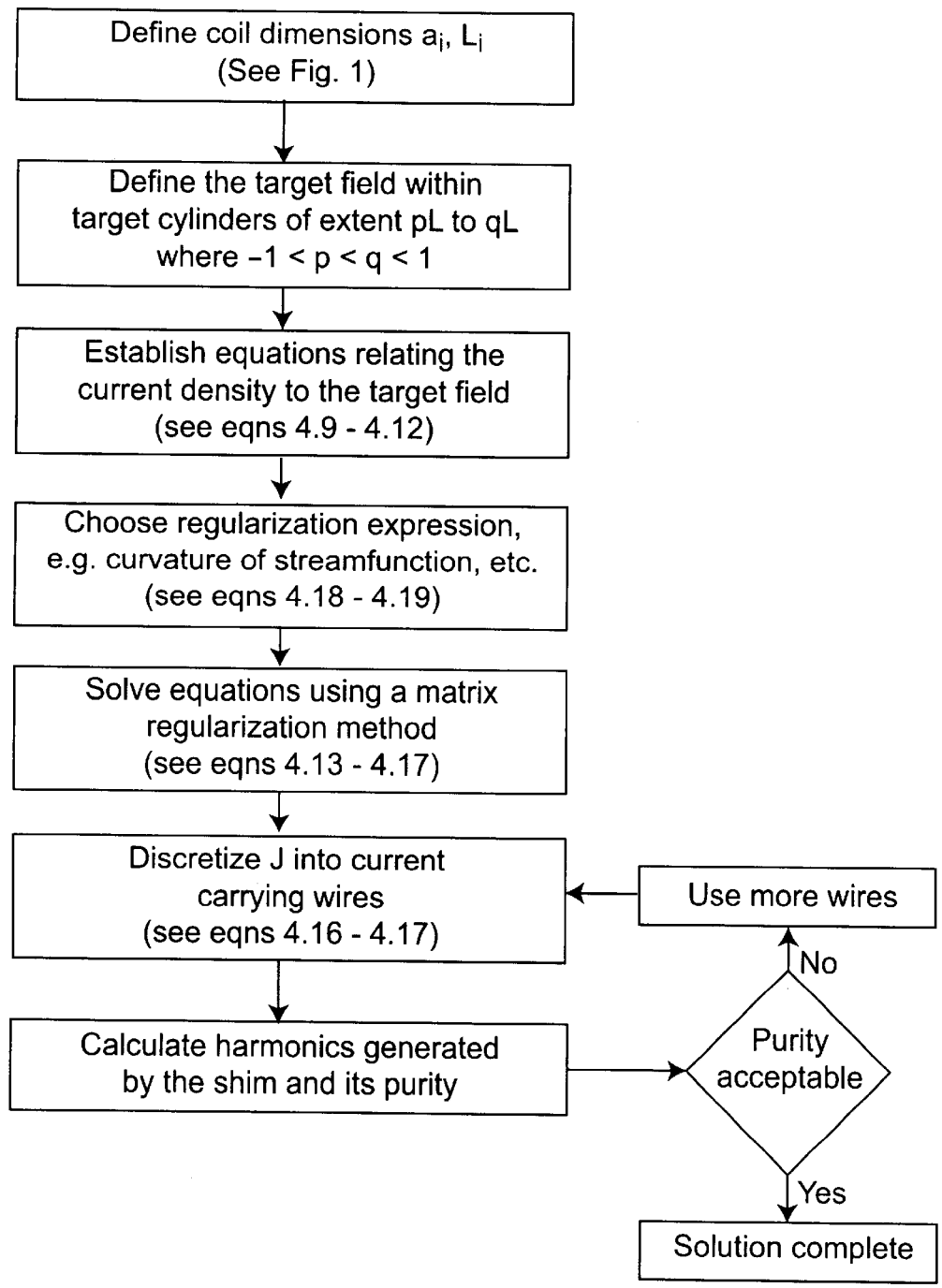

FIG. 10 is a flow chart useful in describing and understanding certain of the method aspects of the invention.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

5. DETAILED DESCRIPTION OF EMBODIMENTS OF THE INVENTION

As discussed above, the present invention relates to tesseral coils having prescribed properties and to methods for designing these and other types of coils. FIG. 10 illustrates the overall numerical procedure of the invention with reference to the various equations presented below.

The method of the invention as described below is preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, C++, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by DIGITAL EQUIPMENT CORPORATION, IBM, HEWLETT-PACKARD, SUN MICROSYSTEMS, SGI or the like. For example, the numerical procedures of the invention can be implemented in C-code and performed on a personal computer. The system should include means for inputting data and means for outputting the results of the coil design both in electronic and visual form. The output can also be stored on a disk drive, tape drive, or the like for further analysis and/or subsequent display.

5.1 The Basic Design Approach

Figure 1:
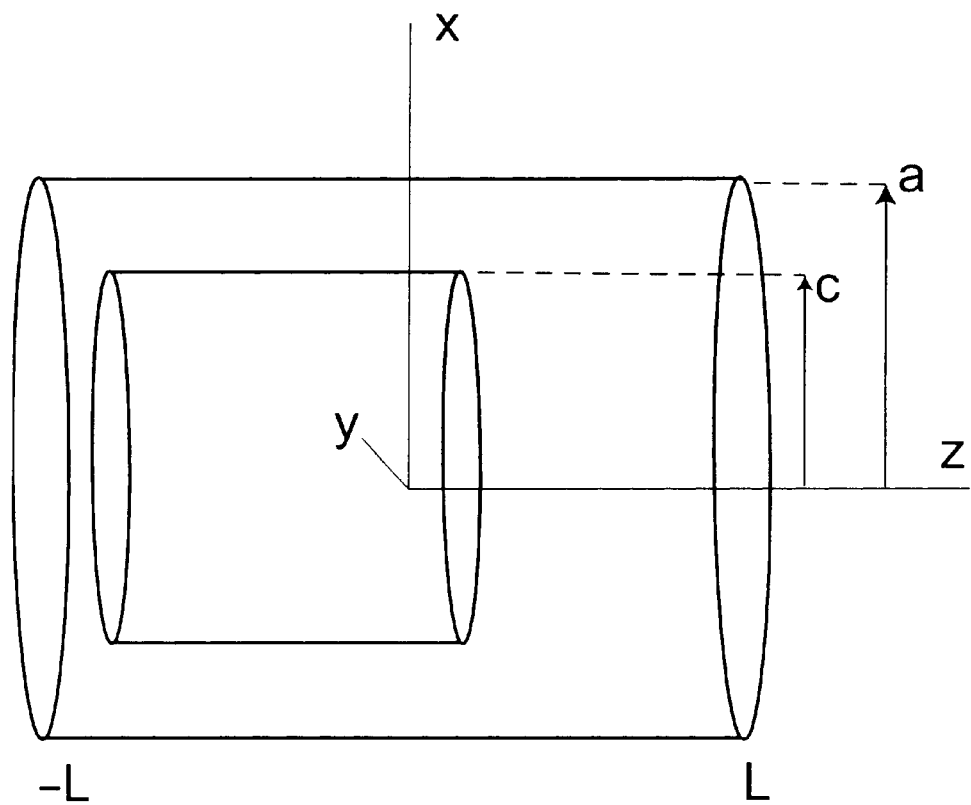
FIG. 1 is a diagram illustrating the coil of radius a and length 2L, with a single internal target region of radius c located asymmetrically along the coil's length. The coordinate system is indicated, in which the z-axis lies along the centre of the coil.

The design of a cylindrical coil of length 2L and radius a, that gives a desired magnetic field at some target radius c within the coil, involves the solution of a well-known mathematical set of equations and boundary conditions. Here, the location of a point within the coil will be given in cylindrical polar coordinates (r,θ,z). The z-axis points along the centre of the coil, which is located over the interval −L<z<L. The target field is located in the interval pL<z<qL, where the numbers p and q are required to satisfy the constraints −1<p<q<1. A sketch of the geometry for this coil and the location of its target field is given in FIG. 1.

The symbol H(r,θ,z) (Amps/meter) will be used to denote the magnetic field vector at such a point, and it is related to the magnetic induction vector B(r,θ,z) (Webers/square meter) by the constitutive relation $B=\mu_0H$, in which the constant $\mu_0$ represents the magnetic permeability of free space. The shim coil may be idealized to be a cylindrical surface on which a current density vector j(θ,z) (Amps/meter) is flowing.

The relationship between the magnetic induction vector B at a field point (r,θ,z) within the coil and the current density vector j on the coil is given by the generalized Biot-Savart law $$B(r) = -\frac{\mu_0}{2\pi}\int\int_S \frac{(r-r') \times j(r')}{\|r-r'\|^3} dA' \qquad (4.1)$$

in which r denotes the field point (r,θ,z) within the coil and r' represents a source point (a,θ',z') on the coil. The surface S is the coil r=a itself. It is convenient to represent the current density vector on the coil in polar coordinates $$j(r') = j_\theta(\theta', z')e_{\theta'} + j_{z'}(\theta', z')e_{z'} \quad (4.2)$$

$$= -\sin\theta' j_\theta(\theta', z')e_x + \cos\theta' j_\theta(\theta', z')e_y + j_z(\theta', z')e_z$$

but to express the magnetic induction field in Cartesian coordinates in the form $$B(r,\theta,z) = B_X(r,\theta,z)e_x + B_Y(r,\theta,z)e_y + B_Z(r,\theta,z)e_z. \quad (4.3)$$

In these equations, the vector $e_x$ denotes the unit vector in the x-direction, with a similar notation applying for the other unit basis vectors.

Equations (4.2) and (4.3) may be substituted into the Biot-Savart law (4.1) to yield expressions for the three components $B_X$, $B_Y$ and $B_Z$ of the induction field. The calculation is straightforward, but the final equations are lengthy and so will not be given in full. It is sufficient here only to give the expression for the component of the magnetic induction field $B_Z$ that points along the centre of the coil (i.e., along the z-axis). The result is $$B_Z(r, \theta, z) = \quad (4.4)$$

$$-\frac{\mu_0 a}{2\pi}\int_0^{2\pi}\int_{-L}^{L}\frac{[r\cos(\theta-\theta')-a]j_\theta(\theta', z')}{([r^2+a^2-2ar\cos(\theta-\theta')+(z-z')^2])^{3/2}}dz'd\theta'.$$

It follows from this equation that the z-component of the induction field only involves the azimuthal component $j_\theta$ of the current density vector. However, this is related to the axial component $j_z$ through the equation of continuity $$\frac{1}{a}\frac{\partial j_\theta(\theta, z)}{\partial \theta} + \frac{\partial j_z(\theta, z)}{\partial z} = 0 \quad (4.5)$$

for the current density on the coil.

The aim is to find an azimuthal current density component $j_\theta(\theta,z)$ on the surface of the coil r=a, over the entire coil length $-L<z<L$, so as to produce a desired magnetic induction field $$B_Z(c,\theta,z) = \mu_0 H_T(c;\theta,z)$$

at some target radius c<a within the coil, and over some restricted interval pL<z<qL. The numbers p and q are arbitrary and satisfy the condition $-1<p<q<1$. Since these numbers may be chosen freely by the designer, the region of interest within the coil may therefore be located asymmetrically with respect to the coil's length. In the following, the axial magnetic field component $H_T(c;\theta,z)$ (Amps/meter) will be referred to as the target field.

It follows from equation (4.4) that the current density component $j_\theta(\theta,z)$ must satisfy the integral equation $$H_T(c; \theta, z) = \quad (4.6)$$

$$-\frac{a}{2\pi}\int_0^{2\pi}\int_{-L}^{L}\frac{[c\cos(\theta-\theta')-a]j_\theta(\theta', z')}{[c^2+a^2-2ac\cos(\theta-\theta')+(z-z')^2]^{3/2}}dz'd\theta',$$

$$pL < z < qL.$$

Equations of this type are well known in the scientific literature (see L. M. Delves and J. L. Mohamed, *Computational Methods for Integral Equations*, Cambridge University Press, Cambridge, 1985). They are known as Fredholm integral equations of the first kind, and the solution of such equations can lead to famously ill-conditioned problems. In the present situation, the equation (4.6) is likely to be so ill-conditioned that, for a given target field $H_T(c;\theta,z)$, there will not be a unique current density function $j_\theta(\theta,z)$ that satisfies the equation. Consequently, some additional constraint must be placed upon the current density $j_\theta$, and this is known as a regularizing condition (see U.S. Pat. No. 6,377,148 B1; L. K. Forbes and S. Crozier, 2001, *A novel target-field method for finite-length Magnetic Resonance shim coils: Part* 1: *Zonal shims*, J. Phys. D: Appl. Phys., vol. 34, 3447–3455, (2001).).

The axial component $j_z$ of the current density must vanish at the ends $z=\pm L$ and so we have chosen to represent it in the form $$j_z(\theta, z) = \sum_{n=1}^{N}\sum_{m=1}^{M}\frac{2\text{ mL}}{n\pi a}(P_{nm}\sin(m\theta) - Q_{nm}\cos(m\theta))\sin\left(\frac{n\pi(z+L)}{2L}\right). \quad (4.7)$$

Here, the coefficients $P_{nm}$ and $Q_{nm}$ are to be found, and the numbers N and M of coefficients may be chosen by the designer, based on the accuracy desired and the availability of computer resources.

The azimuthal component $j_\theta$ of the current density is now obtained from the form (4.7), using the continuity equation (4.5). After some calculation, it is found that the appropriate form for this component is given by the equation $$j_\theta(\theta, z) = \sum_{n=1}^{N}P_{n0}\sin\left(\frac{n\pi(z+L)}{2L}\right) + \quad (4.8)$$

$$\sum_{n=1}^{N}\sum_{m=1}^{M}(P_{nm}\cos(m\theta) + Q_{nm}\sin(m\theta))\cos\left(\frac{n\pi(z+L)}{2L}\right)$$

If this form were to be substituted directly into the governing integral equation (4.6) there would result, after some algebra, a formal expression for the target field in the form $$H_T(c; \theta, z) = \quad (4.9)$$

$$-\sum_{n=1}^{N}P_{n0}U_{n0}(c; z) - \sum_{m=1}^{M}\sum_{n=1}^{N}U_{nm}(c; z)[P_{nm}\cos(m\theta) + Q_{nm}\sin(m\theta)],$$

in which the intermediate functions $U_{n0}(z)$ and $U_{nm}(z)$ are defined by the expressions $$U_{n0}(c; z) = \frac{a}{\pi}\int_{-L}^{L}\int_0^\pi \frac{[c\cos\beta - a]\sin\left(\frac{n\pi(z'+L)}{2L}\right)}{[c^2+a^2-2ac\cos\beta+(z-z')^2]^{3/2}}d\beta dz' \quad (4.10)$$

$$U_{nm}(c; z) =$$

$$\frac{a}{\pi}\int_{-L}^{L}\int_0^\pi \frac{[c\cos\beta - a]\cos(m\beta)\cos\left(\frac{n\pi(z'+L)}{2L}\right)}{[c^2+a^2-2ac\cos\beta+(z-z')^2]^{3/2}}d\beta dz', m \geq 1.$$

It is possible to derive a formal system of equations for the unknown coefficients $P_{nm}$ and $Q_{nm}$ from this relation (4.9) using the standard theory of Fourier series, but as has already been discussed, the system that results is so ill-conditioned that it cannot sensibly be solved, and an alternative procedure is needed.

For arbitrarily large N and M, it can be shown (see L. K. Forbes and S. Crozier, A novel target-field method for finite-length magnetic resonance shim coils: Part 2. Tesseral shims," J.Phys.D.:Appl.Phys. 35 (2002) 839–849) that an appropriate measure of how well equation (4.9) is satisfied is given by the expression $$E(P_{n0}, P_{nm}, Q_{nm}; c) = \int_{pL}^{qL} \left| M_0(c; z) + 2\pi \sum_{n=1}^{N} P_{n0} U_{n0}(c; z) \right|^2 dz + \qquad (4.11)$$

$$\sum_{m=1}^{M} \int_{pL}^{qL} \left| M_m(c; z) + \pi \sum_{n=1}^{N} P_{nm} U_{nm}(c; z) \right|^2 dz +$$

$$\sum_{m=1}^{M} \int_{pL}^{qL} \left| N_m(c; z) + \pi \sum_{n=1}^{N} Q_{nm} U_{nm}(c; z) \right|^2 dz,$$

in which it has been convenient to define the functions $$M_0(c; z) = \int_{-\pi}^{\pi} H_T(c; \beta, z) d\beta$$

$$M_m(c; z) = \int_{-\pi}^{\pi} H_T(c; \beta, z) \cos(m\beta) d\beta$$

$$N_m(c; z) = \int_{-\pi}^{\pi} H_T(c; \beta, z) \sin(m\beta) d\beta, m \geq 1.$$

The error term E in equation (4.11) is actually the square of a norm, in the formal meaning of that term implied by classical mathematical analysis (see see L. K. Forbes and S. Crozier, A novel target-field method for finite-length magnetic resonance shim coils: Part 2. Tesseral shims," J.Phys.D.:Appl.Phys. 35 (2002) 839–849). It is possible to develop a formal algorithm for determining the coefficients $P_{nm}$ and $Q_{nm}$ by least-squares minimization of the error E in equation (4.11), but this again turns out to be so ill-conditioned as to be of little practical value.

The coefficients are instead determined by minimizing a regularized expression of the type $$G(P_{n0}, P_{nm}, Q_{nm}; c) = E(P_{n0}, P_{nm}, Q_{nm}; c) + \lambda F(P_{n0}, P_{nm}, Q_{nm}). \qquad (4.13)$$

In this equation, the parameter $\lambda$ is a regularizing constant, and plays a role similar to that of a Lagrange multiplier (see, for example, J. Stewart, *Calculus*, $4^{th}$ edition, Brooks-Cole, Calif. 1999, pages 985–990.). Here, however, its value is determined by numerical experimentation.

The penalty function F in equation (4.13) may be chosen to be any quantity of practical interest to the designer, and a number of such functions has been tried in the development of the present invention. For example, it is possible to minimize the power in the coil, along with the error term (4.11), by choosing the penalty function to be $$F = \int_S \int \|j\|^2 dA = a \int_{-L}^{L} \int_{-\pi}^{\pi} [j_\theta^2(\theta, z) + j_z^2(\theta, z)] d\theta dz. \qquad (4.14)$$

The expressions (4.7) and (4.8) for the components $j_\theta$ and $j_z$ of the current density vector on the coil are then substituted directly into the equation (4.14), and after some calculation using routine algebra, an expression for F directly in terms of the unknown coefficients $P_{nm}$ and $Q_{nm}$ is obtained (see, for example, equation 4.19 below).

The positive-definite function G in equation (4.13) is now minimized, by requiring that $$\frac{\partial G}{\partial P_{i0}} = 0; \frac{\partial G}{\partial P_{ij}} = 0; \frac{\partial G}{\partial Q_{ij}} = 0, i, j \geq 1. \qquad (4.15)$$

This approach leads to a system of linear matrix equations for the coefficients $P_{n0}$, $P_{nm}$ and $Q_{nm}$ which may be solved using standard software. In fact, the system de-couples, so that the coefficients $P_{nj}$ and $Q_{nj}$, n=1,2, . . . ,N, can be obtained separately, for each value of the index j. This design approach is therefore extremely efficient in its use of computer resources.

Coil designs have been developed using this approach, for which the coil power in equation (4.14) has been minimized, as described. In using this design approach, there is a trade-off between having a well-conditioned system of equations to solve (which can be achieved with a sufficient large value of the parameter $\lambda$), and satisfying the governing integral equation (4.6) to a high degree of accuracy (which requires that $\lambda$ in equation (4.13) be small). It is found here that the best results are obtained with $\lambda \approx 10^{-12}$, since this value gives a problem that is sufficiently well conditioned as to be able to be solved, but still retains a high degree of accuracy in reproducing the target field $H_T(c;\theta,z)$. Nevertheless, it has been found that the most accurate fields and the best coil designs are obtained by minimizing a somewhat more abstract penalty function than the power in equation (4.14); this new penalty function is related to the curvature of a streamfunction, and this is now described.

5.2 The Streamfunction, and Optimizing Coil Winding Patterns

In accordance with the invention, the equation of continuity (4.5) for the current density on the surface of the coil at r=a is used to introduce the concept of a streamfunction $\psi$ on the coil. It follows that equation (4.5) is satisfied identically by any function $\psi(\theta,z)$ for which $$j_\theta = \frac{\partial \psi}{\partial z} \text{ and } j_z = -\frac{1}{a}\frac{\partial \psi}{\partial \theta} \qquad (4.16)$$

It can be proved that the current density vector j is parallel to curves $\psi$=constant (i.e., streamlines), and that level curves (contours) of the streamfunction $\psi$ give the shape of the winding pattern required to produce the field. A tutorial review of this material is given by Brideson, Forbes and Crozier (2002, *Determining complicated winding patterns for shim coils using stream functions and the Target-Field method*, Concepts in Magnetic Resonance, vol. 14, 9–19 (2002).).

The streamfunction required in this situation can be obtained from the definition of the total differential in polar coordinates, equations (4.16), and the forms (expansions) given in equations (4.7) and (4.8). After integrating and some algebra, the result is found to be $$\psi(\theta, z) = -\sum_{n=1}^{N} \frac{2L}{n\pi} P_{n0} \cos\left(\frac{n\pi(z+L)}{2L}\right) + \qquad (4.17)$$

$$\sum_{n=1}^{N} \sum_{m=1}^{M} \frac{2L}{n\pi} (P_{nm}\cos(m\theta) + Q_{nm}\sin(m\theta)) \sin\left(\frac{n\pi(z+L)}{2L}\right).$$

Winding patterns, for the coils designed using the methods of this invention, are obtained simply using a contouring routine for the streamfunction in equation (4.17).

By minimizing the curvature of the streamfunction in equation (4.17), very smooth winding patterns are produced, and these should be capable of straightforward manufacture. Therefore, the penalty function F in equation (4.13) is chosen to be $$F = \int\int_S |\nabla^2 \psi|^2 \, dA = \int_{-L}^{L}\int_{-\pi}^{\pi}\left(\frac{1}{a^2}\frac{\partial^2 \psi}{\partial \theta^2} + \frac{\partial^2 \psi}{\partial z^2}\right)^2 a \, d\theta \, dz. \quad (4.18)$$

The form of the streamfunction in equation (4.17) is used directly in the penalty function (4.18), and significant but straightforward calculations yields the result $$F(P_{n0}, P_{nm}, Q_{nm}) = \quad (4.19)$$

$$\pi a L \left\{ 2\sum_{n=1}^{N}\left(\frac{n\pi}{2L}\right)^2 P_{n0}^2 + \sum_{n=1}^{N}\sum_{m=1}^{M}\left(\frac{2Lm^2}{n\pi a^2} + \frac{n\pi}{2L}\right)^2 (P_{nm}^2 + Q_{nm}^2) \right\}.$$

The total error function G in equation (4.13) is combined with the expressions (4.11) and (4.19), and its minimum is sought using differentiation, as in equation (4.15). Once again, a de-coupled system of linear equations is obtained for the coefficients $P_{n0}$, $P_{nm}$ and $Q_{nm}$, and these may be solved extremely efficiently with the aid of a standard matrix solution routine.

5.3 Matching the Target Field at Two Different Radii

In numerical simulations, it is found that the scheme described in section 5.1 is capable of matching the target field $H_T(c;\theta,z)$ to a very high degree of accuracy, and the particular penalty function in section 5.2 produces winding pattern designs that are optimized for smoothness and ease of construction. Tests also suggest, however, that while the magnetic field corresponds closely to the target field at the target radius r=c, it can wander significantly from the desired field at other radii within the coil. A method is therefore desired by which the design techniques of sections 5.1 and 5.2 can be modified to match the target field over a volume, rather than just at a particular radius. This is provided by matching the target field at two different target radii $r=c_1$ and $r=c_2$, and the results give excellent coil designs, as will be discussed in section 5.4

The current density components $j_\theta$ and $j_z$ and the streamfunction $\psi$ are the same as in sections 5.1 and 5.2, and are given in equations (4.7), (4.8) and (4.17). Now, however, the coefficients in these expressions will be altered, so as to match the two target fields $H_T(c_1;\theta,z)$ and $H_T(c_2;\theta,z)$ at the two radii $c_1$ and $c_2$ respectively. Essentially the aim is now to find a current density $j_\theta$ that solves the integral equation (4.6) at the two different radii $c_1$ and $c_2$ simultaneously. In addition to being ill-conditioned, as before, such a problem would now also be over-determined, and it would not normally be expected to have a unique solution for $j_\theta$. However, very good results can nevertheless be obtained using least-squares minimization with regularization, as before. This means that the total error function in equation (4.13) is now replaced with the new expression $$G(P_{n0},P_{nm},Q_{nm};c_1,c_2)=E(P_{n0},P_{nm},Q_{nm};c_1)+E(P_{n0},P_{nm},Q_{nm};c_2)+ \\ \lambda F(P_{n0},P_{nm},Q_{nm}), \quad (4.20)$$

in which the error term E is exactly as defined earlier, in equation (4.11), but now appears twice, at the two different radii $c_1$ and $c_2$ respectively. The penalty function F is again free to be chosen by the designer, but in this embodiment the particular choice given in equations (4.18) and (4.19) will be illustrated.

Once again, the total error function G in equation (4.20) is minimized, using the approach described in equation (4.15). This leads to a de-coupled system of linear matrix equations to be solved for the coefficients $P_{n0}$, $P_{nm}$ and $Q_{nm}$. This system may be written $$\sum_{n=1}^{N} C_{i,j,n} P_{nj} = R_{i,j}^{(1)}, \quad i=1,\ldots,N, \quad j=0,1,\ldots,M \quad (4.21)$$

$$\sum_{n=1}^{N} C_{i,j,n} Q_{nj} = R_{i,j}^{(2)}, \quad i=1,\ldots,N, \quad j=1,\ldots,M$$

in which the matrix coefficients are defined to be $$C_{i,j,n} = \quad (4.22)$$

$$2(1+\delta_{0,j})\pi^2 \int_{pL}^{qL}[U_{ij}(c_1;z)U_{nj}(c_1;z) + U_{ij}(c_2;z)U_{nj}(c_2;z)]dz +$$

$$\lambda \delta_{i,n}\left(\frac{i^2\pi^3 a}{2L}\right)\left(1 + \frac{4L^2 j^2}{i^2\pi^2 a^2}\right)^2$$

and the right-hand side quantities are $$R_{i,j}^{(1)} = -2\pi \int_{pL}^{qL}[M_j(c_1;z)U_{ij}(c_1;z) + M_j(c_2;z)U_{ij}(c_2;z)]dz \quad (4.23)$$

$$R_{i,j}^{(2)} = -2\pi \int_{pL}^{qL}[N_j(c_1;z)U_{ij}(c_1;z) + N_j(c_2;z)U_{ij}(c_2;z)]dz.$$

The symbol $\delta_{i,n}$ in equation (4.22) is the Kronecker delta symbol, and takes the value 1 if its indices are equal, and 0 otherwise. The functions $U_{ij}$ are as defined in equations (4.10), and the quantities $M_j$ and $N_j$ are given in equation (4.12).

The procedure represented by equations (4.21)–(4.23) for designing tesseral shim coils is therefore extremely efficient, because of its de-coupled structure for obtaining the coefficients.

In order to use this design procedure, it is necessary to evaluate a number of functions, defined as integrals. The first group of such functions are those represented by the terms $U_{n0}$ and $U_{nm}$ in equations (4.10). These are evaluated numerically by means of the trapezoidal rule, using, for example, 201 integration points over the interval $-L<z'<L$ and 51 points for the domain $0<\beta<\pi$. It is also necessary to evaluate the expressions (4.12) for the sets of functions $M_m$ and $N_m$, and this is also accomplished using the trapezoidal rule to approximate the integrals, using, for example, 51 grid points. For integrals involving periodic integrands, such as those in equations (4.12), the trapezoidal rule is optimal, since it is known to have extremely high accuracy (see M. Abramowitz and I. A. Stegun, 1972, *Handbook of Mathematical Functions*, $8^{th}$ edition, Dover, N.Y., page 885).

5.4. Results and Example Designs—Unshielded Shims

The preceding section described how this invention can be used to design coils that can generate any desired tesseral field within a cylindrical coil. To illustrate this approach, we present results in this section for four different coil types, that produce $T_{11}$, $T_{21}$, $T_{31}$ and $T_{42}$ tesseral magnetic fields located asymmetrically within coils of genuinely finite length. It will be understood by practitioners skilled in the art that the method presented in this invention may be used to design shim coils that produce other field types of interest. These techniques have been used to design both zonal and tesseral shim coil winding patterns, and for fields that involve complicated combinations of pure spherical harmonics.

In each of the four illustrative designs presented here, the target field will be located in the asymmetrically located interval $pL<z<qL$, with $-1<p<q<1$, for a coil in the region $-L<z<L$. For this purpose, it is convenient to define the non-dimensional variable $$Z_2 = \frac{z}{L} - \frac{p+q}{2} \qquad (5.1)$$

which is used in U.S. Pat. No. 6,377,148 B1; Australian Provisional Patent Application PQ9787; and by Forbes and Crozier (2001, *Asymmetric zonal shim coils for Magnetic Resonance applications*, Med. Phys. 28, 1644–1651). This new coordinate $Z_2$ is centred with respect to the asymmetrically located target field, and it allows the usual formulae for spherical harmonics to be used naturally, for the target region. It will also be useful in the following to define constants $$\beta_T = \frac{q-p}{2}; \quad \gamma_1 = \frac{c_1}{L} \text{ and } \gamma_2 = \frac{c_2}{L}. \qquad (5.2)$$

The standard zonal and tesseral spherical harmonics may be found in the paper by Roméo and Hoult (1984, *Magnetic Field Profiling: Analysis and Correcting Coil Design*, Magn. Reson. Med. 1 44–65), for example.

EXAMPLE 1

The $T_{11}$ Shim Coil

When the $T_{11}$ spherical harmonic is evaluated at the two target radii $r=c_1$ and $c_2$, it gives the two target fields $$H_T(c_1; \theta, z) = H_{max} \cos\theta$$

$$H_T(c_2; \theta, z) = H_{max} \cos\theta. \qquad (5.3)$$

Here, the constant $H_{max}$ is a reference field strength, and it is taken here to have the value 1 Amp/meter for illustrative purposes.

Figure 2:
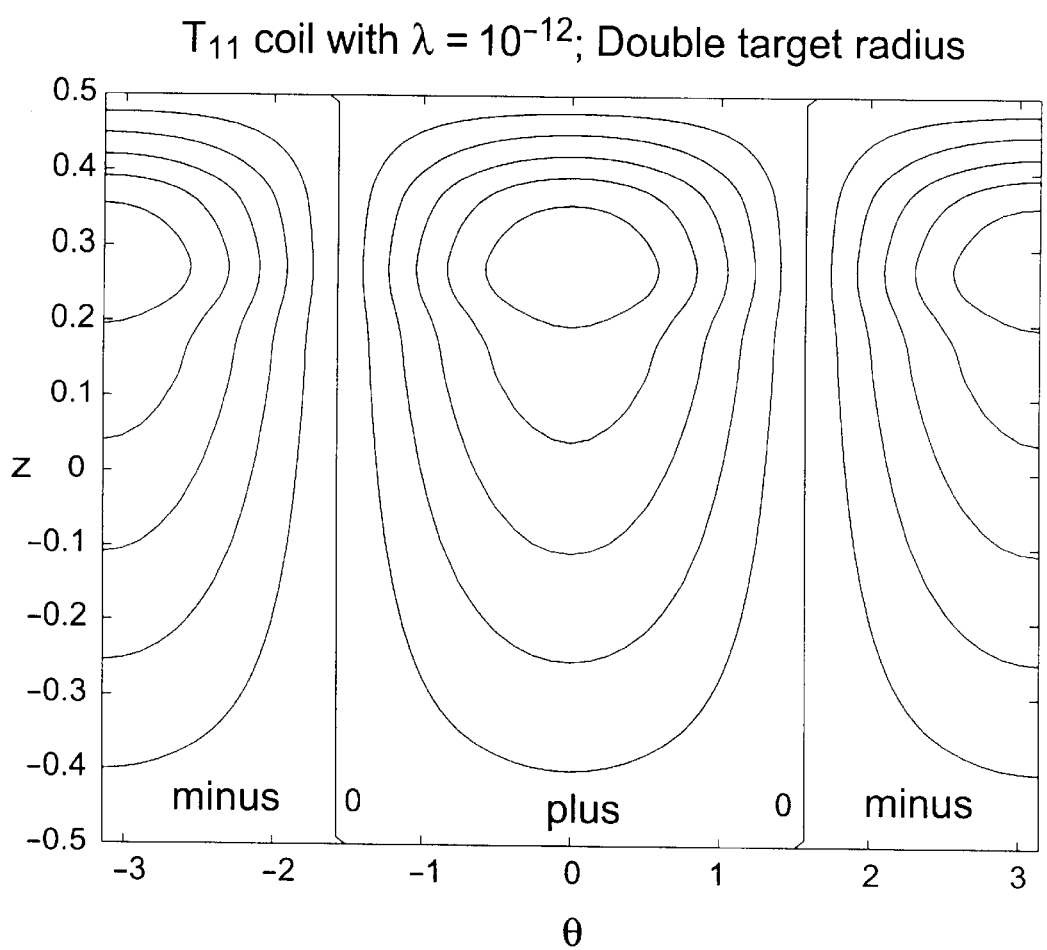
FIG. 2 shows a winding pattern for a $T_{11}$ shim coil, obtained by taking contours of the calculated streamfunction. The parameters used in this calculation are L=0.5 meter, a=0.2 meter, p=−0.7, q=0.1, $c_1$=0.15 meter, $c_2$=0.075 meter and $H_{max}$=1 Amp/meter.

Once the coefficients Phd n0, $P_{nm}$ and $Q_{nm}$ have been determined, the streamfunction $\psi(\theta,z)$ may be evaluated using equation (4.17). The appropriate winding patterns to create the desired coil are then obtained immediately, simply by drawing contours of $\psi$ using standard software. FIG. 2 shows the winding pattern obtained in this way. In this example, the coil length was taken to be $2L=1$ meter and its radius was $a=0.2$ meter. The target field is located in the region defined by parameters $p=-0.7$ and $q=0.1$, and so is located very asymmetrically within the coil. The two target radii were taken to be $c_1=0.15$ meter and $c_2=0.075$ meter.

The winding pattern shown in FIG. 2 is essentially of the saddle-coil type, and consists of two sets of windings on opposite sides of the coil. (The pattern shown in FIG. 2 is wrapped around the surface of the cylinder of radius a, since the horizontal axis in this diagram is actually the angle around the cylinder). The set of windings labelled "plus" carry positive current, and the other set, labelled "minus", are a reverse-winding set carrying negative current. The two vertical contours in the picture are labelled with the number 0, since they carry no current, by symmetry.

Figure 3A:
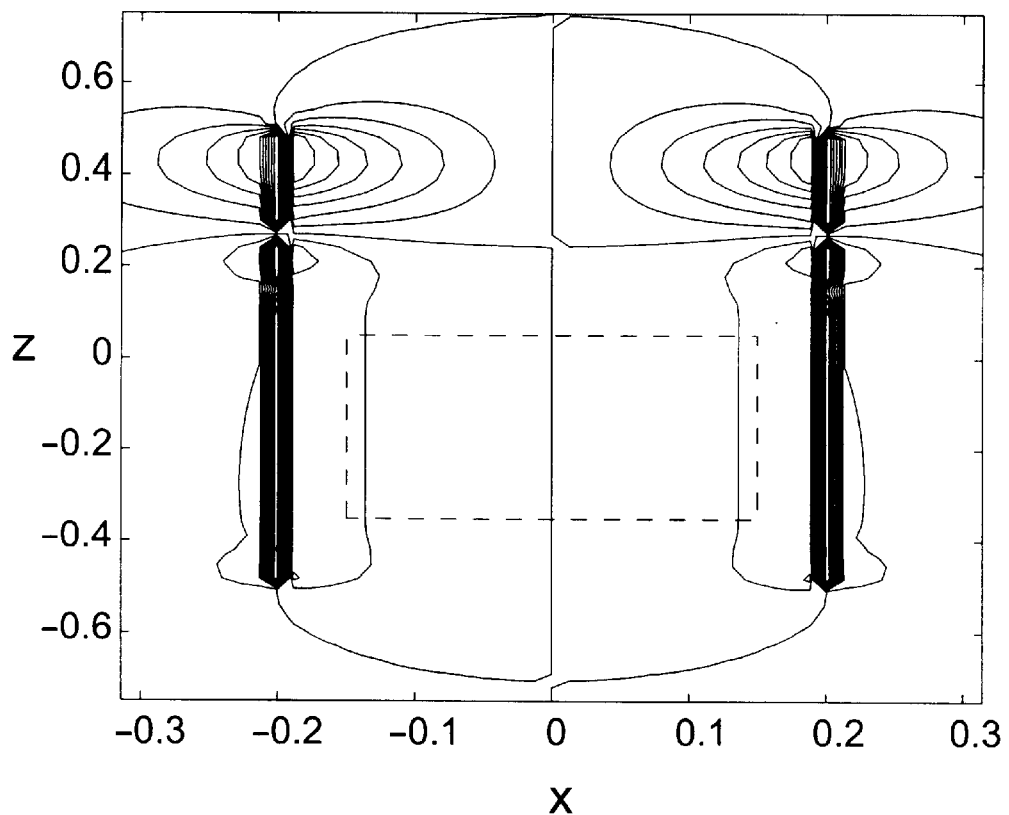
FIG. 3(a) shows contours and FIG. 3(b) shows a stack plot, for the $H_z$ component of the magnetic field produced by the $T_{11}$ shim coil of FIG. 2. The dashed lines in FIG. 3(a) represent the target region.

A cross-section of the axial component $H_Z$ of the magnetic field is shown in FIG. 3. Contours for the field are presented in FIG. 3(a), in the Cartesian x-z plane for y=0. In this figure, the dashed lines indicate the target region within the coil, and in this region, the field is required to vary uniformly and linearly with x, but to be independent of the axial coordinate z, consistent with equations (5.3). This is evidently the case from FIG. 3(a). The field component $H_Z$ is negative on the left interior portion of the coil, and positive on the right, and the vertical contour down the middle of the diagram corresponds to the line $H_Z=0$, as is required by symmetry.

Figure 3B:
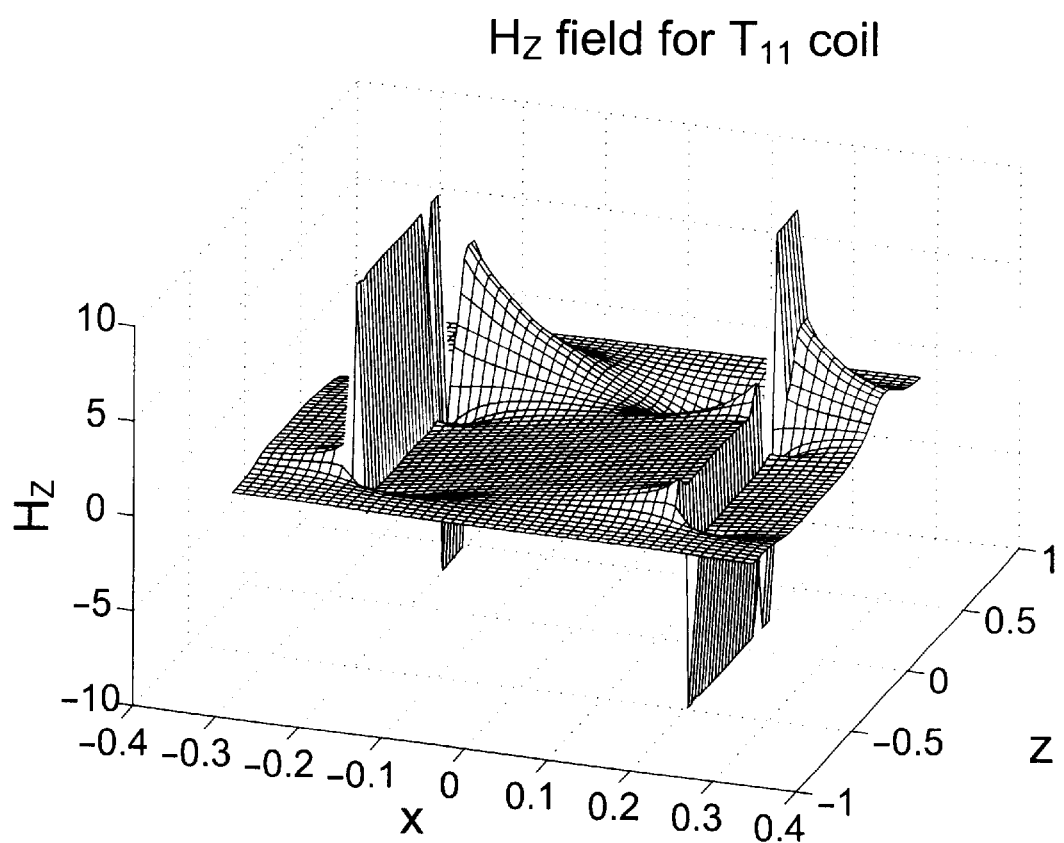

A stack plot of the field on the plane y=0 is given in FIG. 3(b). This shows the anti-symmetric nature of the field about the plane x=0. The linear (gradient) portion of the field in the target region is also clearly evident from this picture.

EXAMPLE 2

The $T_{21}$ Shim Coil

To generate a $T_{21}$ spherical harmonic in the asymmetrically located region $pL<z<qL$, the appropriate target fields at the two radii $c_1$ and $c_2$ are $$H_T(c_1; \theta, z) = H_{max} \frac{Z_2}{\beta_T} \cos\theta \qquad (5.4)$$

$$H_T(c_2; \theta, z) = H_{max} \frac{\gamma_2}{\gamma_1} \frac{Z_2}{\beta_T} \cos\theta.$$

The function $Z_2$ and the various constants in these expressions (5.4) are given in equations (5.1) and (5.2).

FIG. 4(a) shows the contours of the streamfunction $\psi$ that give the winding pattern for the $T_{21}$ coil, in the case in which only a single target field at radius r=c is specified, as in section 5.2. Here, the coil half-length is taken to be $L=0.5$ meter, and its radius is $a=0.2$ meter, as before. The single target radius is $c=0.15$ meter, and the asymmetry parameters are $p=-0.7$ and $q=0.1$. This diagram may be contrasted with FIG. 4(b), which shows the winding pattern for the identical coil, but for the case when two target fields at radii $c_1=0.15$ meter and $c_2=0.075$ meter are used, as in equation (5.4).

In both FIGS. 4(a) and 4(b) the pattern of windings alternates, in the sense that the sign of the current changes for each set of windings. The forward windings are labelled "plus" on FIG. 4(b), and the reverse windings, with negative current, are labelled "minus". The straight line contours, that divide each figure essentially into six portions, are lines along which no current flows.

There are noticeable differences between the results in FIG. 4(a), for a single target radius, and those in FIG. 4(b), in which two target radii were used. In particular, FIG. 4(b) uses more windings in the portion of the coil outside the target region (at the top of the picture), in order to match the target fields more closely at the two target radii. There are also more subtle changes in the shape of the larger contours at the bottom of the picture.

A comparison between the $T_{21}$ fields computed for the single target radius and for two target radii is presented in FIG. 5, for the same values of the parameters as in FIG. 4. The $H_Z$ field is shown as a function of position z along the coil, for the particular angle $\theta=-\pi$, and at the two radii $r=c_1$ and $r=c_2$. The curves drawn with solid lines represent the results obtained for the situation in section 5.3 in which two target radii were used. These results agree with the exact target fields (5.4) to four decimal place accuracy, and the same level of agreement occurs for other angles not shown in FIG. 5. The dashed lines represent the results obtained when only the single target field is used, as in section 5.2, with a target radius $c=0.15$ meter. In that case, the agreement with the target field at the radius $c_1$ is of course very good, and no difference between the fields can be seen in FIG. 5 at that value of the radius. However, at the inner radius $r=c_2$, there is minor disagreement between the two computed fields, as may be seen from the diagram. The curve drawn with the solid line corresponds so closely to the exact target field (5.4) that it may be regarded as essentially exact, but the other curve drawn with the dashed line, representing results from the single target field only, has drifted away slightly from the required field, at this inner radius. This is not surprising, and the discrepancies in this case are not particularly great, but the diagram does serve to show the superior accuracy that is possible when two target radii are used, as described in section 5.3.

A further indication of the effectiveness of this invention is given in Table 1 at the end of this specification, where de-convolution has been used to determine the purity of the $T_{21}$ field established in the asymmetric region $pL<z<qL$. In this example, a shim coil appropriate to whole-body imaging was designed, with coil half-length $L=0.75$ meter and radius $a=0.4$ meter. The parameters that determine the location of the target field are $p=-0.8$ and $q=0.1$, so this is a very asymmetric coil indeed (the offset is $-262.5$ mm). For this coil, two target fields were used, at radii $c_1=0.25$ meter and $c_2=0.005$ meter. The de-convolution was performed at the outer target radius $r=0.25$ meter. The field components are arranged in decreasing percentage of the total, and it is clear that the $T_{21}$ field is accurately reproduced, to within 0.269%, even for such an asymmetrically placed target field.

EXAMPLE 3

The $T_{31}$ Shim Coil

A $T_{31}$ field in the asymmetrically positioned region $pL<z<qL$ requires that the two target fields take the form $$H_T(c_1;\theta,z) = H_{\max}\left(\frac{4Z_2^2-\gamma_1^2}{4\beta_T^2-\gamma_1^2}\right)\cos\theta \tag{5.5}$$

$$H_T(c_2;\theta,z) = H_{\max}\frac{\gamma_2}{\gamma_1}\left(\frac{4Z_2^2-\gamma_2^2}{4\beta_T^2-\gamma_1^2}\right)\cos\theta.$$

As before, the function $Z_2$ and the various constants in these expressions (5.5) are defined in equations (5.1) and (5.2).

FIG. 6 shows the winding pattern required to produce a $T_{31}$ field, in a coil of length $2L=1$ meter and radius $a=0.2$ meter, with two target radii 0.15 and 0.075 meter and asymmetry parameters $p=-0.7$ and $q=0.1$. Reverse windings are again present in the coil, and contours carrying zero current are indicated on the diagram. In this example, the desired target field is produced almost entirely by coil windings placed beyond the target region. Comparison with the exact target field (5.5) confirms that the required fields are reproduced to a high accuracy.

EXAMPLE 4

The $T_{42}$ Shim Coil

The final example is an asymmetrically located $T_{42}$ field. This requires that the target fields at the two radii $c_1$ and $c_2$ should take the forms $$H_T(c_1;\theta,z) = H_{\max}\left(\frac{6Z_2^2-\gamma_1^2}{6\beta_T^2-\gamma_1^2}\right)\cos 2\theta \tag{5.6}$$

$$H_T(c_2;\theta,z) = H_{\max}\left(\frac{\gamma_2}{\gamma_1}\right)^2\left(\frac{6Z_2^2-\gamma_2^2}{6\beta_T^2-\gamma_1^2}\right)\cos 2\theta.$$

The winding pattern for this coil, with the same values of the parameters as above, is shown in FIG. 7. Again, as the pattern is to be wrapped around the surface of a cylinder, there are four distinct sets of windings on the coil surface, with reverse windings indicated by the label "minus". Again, many of the windings are concentrated in the region outside the target zone.

The method for designing tesseral shim coils has been illustrated with particular reference to four example tesseral coils, in which the section of interest (the DSV) has been arbitrarily located within the coil. However, the method of this invention can be applied to the design of coils that produce any tesseral field of interest, whether these fields consist purely of spherical harmonics or otherwise. Fields of exceptional purity can be designed using this technique, by making use of target fields imposed at two different radii internal to the coil.

5.5 Shielded Asymmetric Tesseral Coils

The methods outlined above can be extended to design shim and gradient coils with active shielding.

As before, the primary coil is assumed to be a cylinder of radius a, located over the interval $-L<z<L$. It is now placed within another shielding cylinder of larger radius $b>a$, lying in the interval $-r_bL<z<r_bL$. The constant factor $r_b$ is typically taken to be larger than 1, as the shielding coil is usually longer than the primary coil.

As in section 5.3, the desired magnetic field is matched at two radii $c_1$ and $c_2$ internal to the primary coil, so that $0\leq c_2<c_1<a$. This occurs over the asymmetrically located target interval $pL<z<qL$, with $-1<p<q<1$, as previously. Now the purpose of the shielding coil of radius $r=b$ is to eliminate as much as possible of the magnetic field external to the shielded coil device. This is achieved by introducing a third exterior target radius $c_3>b$ and imposing a zero target field there. This additional target field requirement may therefore be represented by the expression $$H_T(c_3;\theta,z)=0 \text{ on } -sL<z<sL. \tag{6.1}$$

The parameter s defines the interval over which the effect of the shield applies, external to the coil.

A streamfunction is defined on the primary coil $r=a$, and has the form given in equation (4.17). Similarly, a second streamfunction can be defined on the shield $r=b$. It, too, has the same form as in equation (4.17), except that L is replaced by $r_bL$, and an extra set of coefficients is required on the shield, to replace $P_{nm}$ and $Q_{nm}$ in this equation.

A least-squares expression similar to that in equation (4.20) is again minimized, to determine the coefficients $P_{nm}$ and $Q_{nm}$ on the primary coil $r=a$, and an additional equivalent set of coefficients on the shield coil $r=b$. The total error function now consists of error terms E similar to that in equation (4.11), evaluated at the three target radii $c_1$, $c_2$ and $c_3$. In addition, it is regularized using two Lagrange multipliers and two penalty functions similar to that shown in equations (4.18)–(4.19), involving the curvature of the streamfunction on the primary coil $r=a$ and on the shield coil $r=b$.

Results of an example computation are presented in FIG. 8. Here, a $T_{31}$ shim coil has been designed, as indicated in section 5.4 and equations (5.5). The primary coil has length $2L=1$ meter and radius $a=0.2$ meter, and the two interior target radii are $c_1=0.15$ and $c_2=0.075$ meter, as before, with asymmetry parameters $p=-0.7$ and $q=0.1$. The shield coil has length $2r_bL=1.2$ meter and radius $b=0.25$ meter, and the extinction condition (6.1) is imposed at target radius $c_3=0.35$ meter. In this example, the shielding condition is imposed over an interval of length $2sL=1.2$ meter.

FIG. 8(a) shows the winding pattern on the primary coil, and the corresponding pattern for the shield coil is given in FIG. 8(b). As with the unshielded situation, the winding patterns consist of saddle-type arrangements, but involving rather novel shapes. Reverse windings are present in both the primary and the shield coils, and the desired $T_{31}$ field inside the primary coil is produced by windings placed largely outside the target zone. Comparison with the exact interior target field (5.5) again confirms that the desired field has been matched to a good degree of accuracy.

The axial component $H_z$ of the magnetic field has been computed for this case, and contours of the field are presented in FIG. 9, on the plane y=0. The target field is faithfully reproduced over the interior target zone $-0.35<z<0.05$, $0<r<0.15$ meter, although strong field irregularities are clearly visible at each end of the coil, and in particular at the end z=0.5 meter, farthest from the target zone. The active shield placed at radius b=0.25 meter, and having the winding pattern shown in FIG. 8(b), is very effective in eliminating the field beyond the exterior target radius $C_3=0.35$ meter, and this is evident from the Figure.

A shield coil having a length only somewhat longer than the primary coil with which it is used can lead to crowding of the windings on the primary coil which may be undesirable from a manufacturing point of view. Lengthening of the shielding coil (e.g., using an $r_b$ value of 2.0) can reduce this crowding but at the expense of increasing the overall length of the magnetic resonance system which in the case of an MRI system, can add to the feeling of claustrophobia experienced by some patients. Thus, in general, tradeoffs between winding patterns and overall system functionality need to be addressed in the design of shim coils and, in particular, shim coils for MRI applications.

It will be understood by those skilled in the art that various changes to the details presented here may be made, without departing from the spirit and scope of this invention.

TABLE 1

Field analysis for a $T_{21}$ coil with parameters L = 0.75 meter, a = 0.4 meter, p = −0.8, q = 0.1, and using the two target radii $c_1$ = 0.25 meter and $c_2$ = 0.005 meter. The analysis is performed at radius of 250 mm.

| Field Component | Shim 'Name' | Value | Percentage |
| --- | --- | --- | --- |
| B[2][1] | ZY | −3.126193e−06 | 100.000 |
| B[1][1] | Y | −6.723331e−09 | 0.215 |
| B[3][1] | Z2Y | −1.684259e−09 | 0.054 |
| B[3][3] | Y3 | 1.288168e−10 | −4.121e−03 |
| A[1][0] | Z1 | 6.117545e−13 | −1.957e−05 |
| A[6][0] | Z6 | −2.674315e−13 | 8.555e−06 |
| A[4][0] | Z4 | −2.575618e−13 | 8.239e−06 |
| A[5][0] | Z5 | 2.002127e−13 | −6.404e−06 |
| A[3][0] | Z3 | −1.979869e−13 | 6.333e−06 |
| A[2][0] | Z2 | 1.826997e−13 | −5.844e−06 |
| A[2][2] | X2−Y2 | 5.536938e−14 | −1.771e−06 |
| A[0][0] | Z0 | 5.393681e−14 | −1.725e−06 |
| A[3][2] | Z(X2−Y2) | 8.735131e−15 | −2.794e−07 |
| A[2][1] | ZX | −3.975819e−22 | 1.272e−14 |
| A[1][1] | X | 3.290225e−23 | −1.052e−15 |
| B[2][2] | XY | 7.704895e−24 | −2.465e−16 |
| A[3][1] | Z2X | 4.348872e−24 | −1.391e−16 |
| B[3][2] | Z(XY) | 1.935077e−24 | −6.190e−17 |
| A[3][3] | X3 | 1.779721e−24 | −5.693e−17 |

What is claimed is:

1. A tesseral coil having (i) a longitudinal axis and a radius r describing a primary cylindrical surface and (ii) a predetermined volume in which at least one predetermined tesseral harmonic is generated (the tesseral harmonic volume) and comprising a plurality of current-carrying windings associated with the primary cylindrical surface, the tesseral coil producing a magnetic field, the longitudinal component of which is given by:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta)$$

where $A_{nm}$ and $B_{nm}$ are the amplitudes of spherical harmonics, $P_{nm}(\cos\theta)$ are associated Legendre polynomials, n is the order and m the degree of the polynomial, and r, $\theta$ and $\phi$ are polar co-ordinates;

wherein:
(i) the at least one predetermined tesseral harmonic has a degree m' and an order n' which satisfy the relationships:
m'>0, and
n'≧2;
(ii) the primary cylindrical surface has first and second ends which define a length 2L therebetween; and
(iii) the tesseral harmonic volume extends along the longitudinal axis from z=pL to z=qL, where
(a) −1<p<q<1;
(b) |P|≠|q|; and
(c) z=0 is midway between the first and second ends of the primary cylindrical surface.

2. The tesseral coil of claim 1 wherein:
q−p≧0.01.

3. The tesseral coil of claim 1 wherein:
q−p≧0.05.

4. The tesseral coil of claim 1 wherein:
q−p≧0.5.

5. The tesseral coil of claim 1 wherein:
(a) the tesseral harmonic volume defines a midpoint M along the longitudinal axis,
(b) the tesseral harmonic volume has a characteristic radius c given by:

$$c=(q-p)L/2 \text{ when } q-p<1,$$

and by:

$$c=(q-p)L/3 \text{ when } q-p\geq 1;$$

(c) the tesseral coil produces a single predetermined tesseral harmonic; and
(d) the tesseral coil has a purity (P') which is less than or equal to 0.2, where P' equals the ratio of (1) the sum of the magnitudes of all harmonic coefficients other than the coefficient of the single predetermined tesseral harmonic which have a magnitude which is at least 0.001% of the magnitude of the coefficient of the single predetermined tesseral harmonic to (2) the magnitude of the coefficient of the single predetermined tesseral harmonic.

6. The tesseral coil of claim 5 wherein P' is less than or equal to 0.05.

7. The tesseral coil of claim 5 wherein:
(i) n'=2 or 3;
(ii) q−p≧0.7;
(iii) 2L≦1.4 meters; and
(iv) P'≧0.1.

8. The tesseral coil of claim 5 wherein:
(i) n'=4, 5, 6, 7, or 8;
(ii) q−p≧0.7; and
(iii) 2L≦1.4 meters.

9. The tesseral coil of claim 1 wherein:
(a) the tesseral harmonic volume defines a midpoint M along the longitudinal axis, (b) the tesseral harmonic volume has a characteristic radius c given by:

$$c=(q-p)L/2 \text{ when } q-p<1,$$

and by:

$$c=(q-p)L/3 \text{ when } q-p \geq 1;$$

(c) the tesseral coil produces a plurality of predetermined tesseral harmonics; and (d) the tesseral coil has a purity (P') which is less than or equal to 0.2, where P' equals the ratio of (1) the sum of the magnitudes of all harmonic coefficients other than the coefficients of the plurality of predetermined tesseral harmonics which have a magnitude which is at least 0.001% of the magnitude of the largest coefficient of the plurality of predetermined tesseral harmonics to (2) the sum of the magnitudes of the coefficients of the plurality of predetermined tesseral harmonics.

10. The tesseral coil of claim 9 wherein P' is less than or equal to 0.05.

11. The tesseral coil of claim 1 wherein $|p|$ or $|q|$ is greater than or equal to 0.7.

12. The tesseral coil of claim 1 wherein the coil generates at least one additional predetermined tesseral harmonic in the tesseral harmonic volume, said at least one additional harmonic having a degree different from m' and/or an order different from n'.

13. The tesseral coil of claim 1 further comprising a shielding cylindrical surface co-axial and external to the primary cylindrical surface, said shielding cylindrical surface having a plurality of current-carrying windings associated therewith, said windings of the primary and shielding cylindrical surfaces causing the magnitude of the magnetic field generated by the tesseral coil to be below a predetermined value outside of a predetermined surface external to the shielding cylindrical surface.

14. The tesseral coil of claim 13 wherein the shielding cylindrical surface has first and second ends which define a length 2L' therebetween, where $L'=-r_bL$ and $r_b$ is greater than or equal to 1.0.

15. A shim set comprising a plurality of coils at least one of which is a tesseral coil defined by claim 13.

16. The shim set of claim 15 wherein each of the coils in the shim set is a tesseral coil defined by claim 13.

17. A magnetic resonance system comprising the shim set of claim 15.

18. The tesseral coil of claim 1 wherein the coil is a shim coil for a magnetic resonance system.

19. A shim set comprising a plurality of coils at least one of which is a tesseral coil defined by claim 1.

20. The shim set of claim 19 wherein each of the coils in the shim set is a tesseral coil defined by claim 1.

21. A magnetic resonance system comprising the shim set of claim 19.

22. A method for designing a coil, where the coil has a longitudinal axis which lies along the z-axis of a three dimensional coordinate system, said method comprising the steps of:

(a) selecting one or more cylindrical surfaces $S_i$ ($i \geq 1$) for calculating current densities for the coil, each surface (1) having a radius $a_1$, (2) surrounding the longitudinal axis, and (3) extending from $-L_i$ to $+L_i$;

(b) selecting a set of desired values for the longitudinal component of the magnetic field $B_z$ (or $H_T$) to be produced by the coil at target locations on one or more cylindrical surfaces $T_j$ ($j \geq 1$) which extend along the longitudinal axis from $z=pL_i$ to $z=qL_i$ where $i=1$ and $-1<p<q<1$; and (c) determining current density distributions $j_i(\theta,z)$ at the $S_i$ surfaces for the coil by:
(1) expressing $B_z$ (or $H_T$) in terms of $j_i(\theta,z)$;
(2) expressing the z-component of each of the $j_i(\theta,z)$ ($j_{zi}(\theta,z)$) in terms of a basis function expansion and constraining $j_{zi}(\theta,z)$ to equal 0 at $-L_i$ and $+L_i$, said expansion including a set of coefficients;
(3) expressing $B_z$ (or $H_T$) in terms of said basis function expansions; and
(4) for each of $j_{zi}(\theta,z)$, determining values for said set of coefficients of said basis function expansion by:
  i. selecting an error function which comprises a measure of the difference between the desired $B_z$ (or $H_T$) values at the target locations and the $B_z$ values calculated at those locations using the basis function expansions of the $j_{zi}(\theta,z)$;
  ii. regularizing said error function; and
  iii. determining values for the sets of coefficients using the regularized error function; and
(5) determining the azimuthal-component of $j_i(\theta,z)$ ($j_{\theta i}(\theta,z)$) using the values for the sets of coefficients determined in step (c)(4) and the continuity equation.

23. The method of claim 22 wherein in step (c)(4)ii, the regularization employs one or more regularization parameters, one parameter for each $j_i(\theta,z)$, said parameter being the curvature of a streamfunction for $j_i(\theta,z)$.

24. The method of claim 22 wherein in step (c)(4)ii, the regularization employs a regularization parameter which is the power dissipated in the coil.

25. The method of claim 22 wherein in step (c)(4)ii, the regularization employs a regularization parameter which is the energy stored in the coil.

26. The method of claim 22 wherein $|p|=|q|$.

27. The method of claim 22 wherein $|p| \neq |q|$.

28. The method of claim 22 wherein i equals 2, a primary coil is located at $S_1$ and a shielding coil is located at $S_2$.

29. The method of claim 28 wherein j equals 3, $T_1$ and $T_2$ are internal to $S_i$, $T_3$ is external to $S_2$, and the desired values for the longitudinal component of the magnetic field $B_z$ (or $H_T$) on $T_3$ are zero.

30. The method of claim 22 further comprising generating discrete current carrying windings for each of the $j_i(\theta,z)$ by:
(1) determining a streamfunction $\psi$ for the $j_i(\theta,z)$;
(2) selecting a number of current carrying windings N;
(3) determining a current per winding value I=J/N, where J is the total obtained by integrating $j_i(\theta,z)$ over $S_i$;
(4) contouring the streamfunction 4, and thereby determining a set of $j_i(\theta,z)$ blocks over the $S_i$ surface within the longitudinal range from $-L_i$ to $+L_i$ such that the integral of $j_i(\theta,z)$ over each block equals I; and
(5) for all blocks having a net polarity for $j_i(\theta,z)$ over the block, placing a winding at the center of the block, the direction of the current in the winding corresponding to said net polarity.

31. The method of claim 30 comprising the additional step of producing a coil having said discrete current carrying windings.

32. The method of claim 22 comprising the additional step of displaying at least one of the $j_i(\theta,z)$ or a component thereof.

33. An article of manufacture comprising a computer usable medium having computer readable code means embodied therein for designing a coil in accordance with the method of claim 22.

34. Apparatus for designing a coil comprising a programmed computer for performing the method of claim 22.

35. A method for designing a coil comprising:
(a) selecting one or more surfaces $S_i$ ($i \geq 1$) for calculating current densities for the coil;
(b) selecting a set of desired values for one or more components of the magnetic field B (or H) to be produced by the coil at target locations on one or more surfaces $T_j$ ($j \geq 1$); and
(c) determining current density distributions $j_i$ at the $S_i$ surfaces for the coil by:
  (1) expressing B (or H) in terms of $j_i$;
  (2) expressing each of the $j_i$ in terms of a basis function expansion having a set of coefficients;
  (3) expressing B (or H) in terms of said basis function expansions; and
  (4) for each $j_i$ determining values for said set of coefficients of said basis function expansion by:
    i. selecting an error function which comprises a measure of the difference between the desired B (or H) values at the target locations and B (or H) values calculated at those locations using the basis function expansions of the $j_i$;
    ii. regularizing said error function using one or more regularization parameters, one parameter for each $j_i$, said parameter being the curvature of a streamfunction for $j_i$; and
    iii. determining values for the sets of coefficients using the regularized error function.

36. The method of claim 35 wherein i equals 1 and j equals 1.

37. The method of claim 35 wherein i equals 2, a primary coil is located at $S_1$ and a shielding coil is located at $S_2$.

38. The method of claim 37 wherein j equals 3, $T_1$ and $T_2$ are internal to $S_1$, $T_3$ is external to $S_2$, and the desired values for the magnetic field B (or H) on $T_3$ are zero.

39. The method of claim 35 further comprising generating discrete current carrying windings for each of the $j_i$ by:
(1) selecting a number of current carrying windings N;
(2) determining a current per winding value I=J/N, where J is the total obtained by integrating $j_i$ over $S_i$;
(4) contouring the streamfunction used in step (4)ii and thereby determining a set of $j_i$ blocks over the $S_i$ surface such that the integral of $j_i$ over each block equals I; and
(5) for all blocks having a net polarity for $j_i$ over the block, placing a winding at the center of the block, the direction of the current in the winding corresponding to said net polarity.

40. The method of claim 39 comprising the additional step of producing a coil having said discrete current carrying windings.

41. The method of claim 35 comprising the additional step of displaying at least one of the $j_i$ or a component thereof.

42. An article of manufacture comprising a computer usable medium having computer readable code means embodied therein for designing a coil in accordance with the method of claim 35.

43. Apparatus for designing a coil comprising a programmed computer for performing the method of claim 35.

* * * * *

UNITED STATES PATENT AND TRADEMARK OFFICE
CERTIFICATE OF CORRECTION

PATENT NO. : 6,664,879 B2  Page 1 of 1
APPLICATION NO. : 10/234971
DATED : December 16, 2003
INVENTOR(S) : Lawrence Kennedy Forbes and Stuart Crozier It is certified that error appears in the above-identified patent and that said Letters Patent is hereby corrected as shown below:

Column 20/line 59 "$\geq$" should read --$\leq$--

Column 22/line 50 "4" should read --$\psi$--

Signed and Sealed this

Fourteenth Day of August, 2007

JON W. DUDAS
*Director of the United States Patent and Trademark Office*